United States Patent
Park et al.

(10) Patent No.: US 6,760,242 B1
(45) Date of Patent: Jul. 6, 2004

(54) CONTENT ADDRESSABLE MEMORY (CAM) DEVICES HAVING SPEED ADJUSTABLE MATCH LINE SIGNAL REPEATERS THEREIN

(75) Inventors: Kee Park, San Jose, CA (US); Scott Yu-Fan Chu, Cupertino, CA (US)

(73) Assignee: Integrated Device Technology, Inc., Santa Clara, CA (US)

(*) Notice: Subject to any disclaimer, the term of this patent is extended or adjusted under 35 U.S.C. 154(b) by 8 days.

(21) Appl. No.: 10/323,236

(22) Filed: Dec. 18, 2002

Related U.S. Application Data

(60) Provisional application No. 60/371,491, filed on Apr. 10, 2002.

(51) Int. Cl.[7] .......................... G11C 15/00; G06F 12/00
(52) U.S. Cl. ...................... 365/49; 365/230.03; 711/108
(58) Field of Search ............................ 365/49, 230.03, 365/233, 203, 189.11; 711/108

(56) References Cited

U.S. PATENT DOCUMENTS

| | | | | |
|---|---|---|---|---|
| 5,327,372 A | * | 7/1994 | Oka et al. ...................... 315/49 |
| 5,446,685 A | * | 8/1995 | Holst ........................... 365/49 |
| 5,517,441 A | * | 5/1996 | Dietz et al. .................... 365/49 |
| 5,598,115 A | * | 1/1997 | Holst ........................... 326/119 |
| 5,706,224 A | * | 1/1998 | Srinivasan et al. ............ 365/49 |
| 5,852,569 A | * | 12/1998 | Srinivasan et al. ............ 365/49 |
| 5,859,791 A | | 1/1999 | Schultz et al. ................. 365/49 |
| 5,936,873 A | | 8/1999 | Kongetira ..................... 365/49 |
| 5,964,857 A | | 10/1999 | Srinivasan et al. .......... 710/126 |
| 5,978,246 A | | 11/1999 | Shindo ......................... 365/49 |
| 6,044,005 A | | 3/2000 | Gibson et al. ................. 365/49 |
| 6,101,115 A | | 8/2000 | Ross ............................ 365/49 |
| 6,101,116 A | | 8/2000 | Lien et al. .................... 365/49 |
| 6,125,049 A | | 9/2000 | Nataraj ......................... 365/49 |
| 6,128,207 A | | 10/2000 | Lien et al. .................... 365/49 |
| 6,147,891 A | | 11/2000 | Nataraj ......................... 365/49 |
| 6,166,939 A | | 12/2000 | Nataraj et al. ................ 365/49 |
| 6,175,514 B1 | | 1/2001 | Henderson et al. ........... 365/49 |
| 6,191,969 B1 | | 2/2001 | Pereira ......................... 365/49 |
| 6,191,970 B1 | | 2/2001 | Pereira ......................... 365/49 |
| 6,240,001 B1 | | 5/2001 | Ross ............................ 365/49 |
| 6,243,280 B1 | | 6/2001 | Wong et al. .................. 365/49 |
| 6,256,216 B1 | | 7/2001 | Lien et al. .................... 365/49 |
| 6,262,907 B1 | | 7/2001 | Lien et al. .................... 365/49 |
| 6,262,929 B1 | | 7/2001 | Miyatake et al. ........... 365/203 |
| 6,324,087 B1 | | 11/2001 | Pereira ......................... 365/49 |
| 6,341,079 B1 | | 1/2002 | Chadwick .................... 365/49 |
| 6,343,029 B1 | | 1/2002 | Kengeri et al. ............... 365/49 |
| 6,349,049 B1 | | 2/2002 | Schoy .......................... 365/49 |
| 6,362,993 B1 | | 3/2002 | Henderson et al. ........... 365/49 |
| 6,370,613 B1 | | 4/2002 | Diede et al. ................. 711/108 |
| 6,373,738 B1 | | 4/2002 | Towler et al. ................ 365/49 |
| 6,385,072 B1 | * | 5/2002 | Yoneda ........................ 365/49 |
| 6,430,074 B1 | | 8/2002 | Srinivasan ................... 365/49 |
| 6,452,822 B1 | | 9/2002 | Chai et al. .................... 365/49 |
| 6,499,081 B1 | | 12/2002 | Nataraj et al. .............. 711/108 |

* cited by examiner

*Primary Examiner*—David Lam
(74) *Attorney, Agent, or Firm*—Myers Bigel Sibley & Sajovec

(57) ABSTRACT

Content addressable memory (CAM) devices according to embodiments of the present invention conserve match line and bit line power when CAM array blocks therein are searched. These CAM array blocks are searched in a pipelined segment-to-segment manner to increase search speed. The pipelined search operations may also be interleaved with write and read operations in an efficient manner that reduces the occurrence of pipeline bubbles.

22 Claims, 16 Drawing Sheets

CONTENT ADDRESSABLE MEMORY (CAM) DEVICES HAVING SPEED ADJUSTABLE MATCH LINE SIGNAL REPEATERS THEREIN

REFERENCE TO PRIORITY APPLICATION

This application claims priority to U.S. Provisional Application Serial No. 60/371,491, filed Apr. 10, 2002, the disclosure of which is hereby incorporated herein by reference.

FIELD OF THE INVENTION

The present invention relates to integrated circuit memory devices and, more particularly, to content addressable memory (CAM) devices and methods of operating same.

BACKGROUND OF THE INVENTION

In many memory devices, including random access memory (RAM) devices, data is typically accessed by supplying an address to an array of memory cells and then reading data from the memory cells that reside at the supplied address. However, in content addressable memory (CAM) devices, data is not accessed by initially supplying an address, but rather by initially applying data (e.g., search words) to the device and then performing a search operation to identify one or more entries within the CAM device that contain data equivalent to the applied data and thereby represent a "match" condition. In this manner, data is accessed according to its content rather than its address. Upon completion of the search operation, the identified location(s) containing the equivalent data is typically encoded to provide an address (e.g., CAM array block address+ row address within a block) at which the matching entry is located. If multiple matching entries are identified in response to the search operation, then local priority encoding operations may be performed to identify a location of a best or highest priority matching entry. Such priority encoding operations frequently utilize the relative physical locations of multiple matching entries within the CAM device to identify a highest priority matching entry. An exemplary CAM device that utilizes a priority encoder to identify a highest priority matching entry is disclosed in commonly assigned U.S. Pat. No. 6,370,613 to Diede et al., entitled "Content Addressable Memory with Longest Match Detect," the disclosure of which is hereby incorporated herein by reference. The '613 patent also discloses the use of CAM sub-arrays to facilitate pipelined search operations. Additional CAM devices are described in U.S. Pat. Nos. 5,706,224, 5,852,569 and 5,964,857 to Srinivasan et al. and in U.S. Pat. Nos. 6,101,116, 6,256,216, 6,128,207 and 6,262,907 to Lien et al., the disclosures of which are hereby incorporated herein by reference.

CAM cells are frequently configured as binary CAM cells that store only data bits (as "1" or "0" logic values) or as ternary CAM cells that store data bits and mask bits. As will be understood by those skilled in the art, when a mask bit within a ternary CAM cell is inactive (e.g., set to a logic 1 value), the ternary CAM cell may operate as a conventional binary CAM cell storing an "unmasked" data bit. When the mask bit is active (e.g., set to a logic 0 value), the ternary CAM cell is treated as storing a "don't care" (X) value, which means that all compare operations performed on the actively masked ternary CAM cell will result in a cell match condition. Thus, if a logic 0 data bit is applied to a ternary CAM cell storing an active mask bit and a logic 1 data bit, the compare operation will indicate a cell match condition. A cell match condition will also be indicated if a logic 1 data bit is applied to a ternary CAM cell storing an active mask bit and a logic 0 data bit. Accordingly, if a data word of length N, where N is an integer, is applied to a ternary CAM array block having a plurality of entries therein of logical width N, then a compare operation will yield one or more match conditions whenever all the unmasked data bits of an entry in the ternary CAM array block are identical to the corresponding data bits of the applied search word. This means that if the applied search word equals {1011}, the following entries will result in a match condition in a CAM comprising ternary CAM cells: {1011}, {X011}, {1X11}, {10X1}, {101X}, {XX11}, {1XX1}), . . . , {1XXX}, {XXXX}.

FIG. 1 herein illustrates a conventional CAM device having a plurality of CAM array blocks therein arranged in a plurality of rows and columns. The CAM array blocks in the first, second, third and fourth rows are illustrated as $CAM_{00}$–$CAM_{07}$, $CAM_{10}$–$CAM_{17}$, $CAM_{20}$–$CAM_{27}$ and $CAM_{30}$–$CAM_{37}$. A respective row priority encoder is also provided between each pair of CAM array blocks. Thus, as illustrated, the CAM device of FIG. 1 includes sixteen (16) row priority encoders (shown as Row Priority Encoder$_{00}$–Row Priority Encoder$_{33}$). These row priority encoders perform final encoding of all match information generated by a respective pair of CAM array blocks. A respective global word line decoder is also provided for each row of CAM array blocks. As will be understood by those skilled in the art, each global word line decoder provides word line signals to the CAM array blocks of a respective row during reading and writing operations. These word line signals may be provided on global word lines. An exemplary row priority encoder is disclosed in U.S. Pat. No. 6,307,767 to Fuh.

Conventional techniques to reduce power consumption within CAM devices are disclosed in U.S. Pat. Nos. 6,191,969 and 6,191,970 to Pereira. In particular, the '969 patent discloses a CAM array having CAM cells therein that include a discharge circuit connected between each cell and a fixed ground potential. Each of the discharge circuits include a control terminal coupled to receive a control signal indicative of the logical state of a match line segment in a respective row. These discharge circuits may be turned off to prevent discharge of respective match line segments during a search operation. U.S. Pat. No. 6,243,280 to Wong et al. also discloses a conventional technique to reduce power consumption by providing selective precharge of match line segments during a search operation. U.S. Pat. No. 5,517,441 to Dietz et al. discloses the use of inverters and pull-down transistors to pass match line signals from one match line segment to another match line segment during a search operation. U.S. Pat. Nos. 5,446,685 and 5,598,115 to Holst also disclose the use of rail-to-rail (i.e., Vdd-to-Vss) pulsed ground signals during search operations.

Notwithstanding these conventional techniques to reduce match line power consumption in partitioned CAM array blocks, there continues to be a need for techniques to further reduce power consumption in high capacity CAM devices having large numbers of CAM array blocks therein.

SUMMARY OF THE INVENTION

Content addressable memory (CAM) devices according to embodiments of the present invention conserve match line and bit line power when CAM array blocks therein are searched. These CAM array blocks are searched in a pipelined segment-to-segment manner to increase search speed.

The pipelined search operations may also be interleaved with write and read operations in an efficient manner that reduces the occurrence of pipeline bubbles.

A CAM array according to an embodiment of the present invention includes a first plurality of rows CAM cells that are partitioned into at least two segments. These segments may include a xR segment and a xS segment. In some preferred embodiments, the xS segment may be longer than the xR segment. A match line control circuit is also provided. The match line control circuit may be disposed as a column of circuitry that extends between the xR and xS segments of the CAM array. In some embodiments, the match line control circuit includes a plurality of latches that are configured to receive a first plurality of match line signals developed in the xR segment during a xR search operation. The control circuit may also include boolean logic, which is electrically coupled to outputs of the plurality of latches. This boolean logic may be configured to evaluate match conditions determined by the plurality of match line signals and conserve power by selectively blocking discharge of at least one precharged pseudo-ground line segment in the xS segment of the CAM array during a xS search operation when the match conditions indicate that no matching entries are present in the first plurality of rows of CAM cells.

A content addressable memory (CAM) device according to another embodiment of the present invention includes a CAM array block having a first row of CAM cells therein. This first row may include first match line segment that is electrically coupled to a first segment of CAM cells in the first row and a second match line segment that is electrically coupled to a second segment of CAM cells in the first row. A pseudo-ground line segment that is electrically connected to the first and second segments of CAM cells may also be provided. The first row may also include a speed adjustable match line signal repeater. This match line signal repeater is configured to detect and propagate a miss signal transition from the first match line segment to the second match line segment during a search operation.

According to preferred aspects of these embodiments, the match line signal repeater is configured to propagate the miss signal transition in-sync with an active high-to-low transition of the pseudo-ground line segment from a maximum high voltage of (Vdd−Vth) to a low voltage of Vss, where Vdd is a power supply voltage, Vth is a threshold voltage of an NMOS transistor and Vss is a ground reference voltage. The match line signal repeater may also include an inverter having an input that is electrically coupled to the first match line segment, an output and a sensitivity control terminal. To speed of the inverter in detecting a miss signal transition on the match line may be varied by including a voltage-controlled impedance element between the sensitivity control terminal of the inverter and a reference supply line. This element may be an NMOS bias transistor having a gate electrode that receives an adjustable N-bias voltage.

Additional embodiments of the present invention include methods of operating a content addressable memory (CAM) array. These methods may include writing a xR segment of a first row in the CAM array with a xR segment of a first write word while concurrently searching a xS segment of the same CAM array with a xS segment of a first search word. This step of writing a xR segment of a first row in the CAM array may be preceded by the step of searching a xR segment of the CAM array with a xR segment of the first search word. This step may also be followed by the step of searching the xR segment of the CAM array with a xR segment of a second search word while concurrently writing a xS segment of the first row with a xS segment of the first write word.

Still further methods may include writing a xR segment of a first row in the CAM array with a xR segment of a first write word while concurrently writing a xS segment of a second row in the same CAM array.

According to additional embodiments of the present invention, a method of operating a CAM array may include precharging a first match line segment and a first pseudo-ground line segment associated with a row of CAM cells in the CAM array to maximum voltages of $V_{ml}$ and $(V_{ml}-\alpha)$, respectively, during a precharge operation, where $0.1(V_{ml}) < \alpha < \frac{1}{2}V_{ml}$. The row of CAM cells may then searched by switching the precharged first pseudo-ground line segment high-to-low and evaluating the first match line segment to determine whether a matching entry is present in the row of CAM cells. In further embodiments, the precharging step includes precharging the first pseudo-ground line segment through an NMOS pull-up transistor having a threshold voltage equal to Vth, where Vth equals $\alpha$, and $V_{ml}$ equals a power supply voltage (Vdd).

A pipelined search operation may also conserve bit line power by withholding application of second bits of a new search word to bit lines in the CAM array block until after at least one partial match has been detected between first bits of the new search word and the entries in the CAM array block. If at least one partial match is not detected within a respective segment of the CAM array block, the bit lines associated with the next higher segment are not actively driven with the corresponding bits of the new search word and the search operation terminates without discharging the match and pseudo-ground lines associated with the next higher segment(s). These operations are preferably performed on CAM array blocks having a logical width of xN bits. In some embodiments, one search word having a width of xN bits may be loaded into the CAM device in-sync with each leading edge of a clock signal. In other embodiments, search words of xN bits may be loaded into the CAM device on every leading and trailing edges of a clock signal.

According to a preferred aspect of another embodiment of the present invention, a CAM array block includes first bit lines associated with first columns in the CAM array block and second bit lines associated with second columns in the CAM array block and the search operation includes driving the first bit lines with the first bits of the new search while simultaneously applying bits of an old search word to the second bit lines by floating one or more of the second bit lines. The CAM array block may also include third bit lines associated with third columns therein and the search operation may include driving the first bit lines with the first bits of the new search word while simultaneously applying global mask bits to the third bit lines. An operation to apply global mask bits may include floating one or more of the third bit lines at a mask voltage level (e.g., logic 0 voltage level). The first columns may be arranged as a first plurality of consecutively ordered columns and the second and third columns may be collectively arranged as a second plurality of consecutively ordered columns. In particular, each of a plurality of rows in a CAM array block may be partitioned into a xL segment, a xM segment and a xN segment, where L, M and N are positive integers and L<M<N. In particular, L, M and N may be positive integers that meet the following requirement: $2L \leq M$ and $2M \leq N$.

BRIEF DESCRIPTION OF THE DRAWINGS

FIG. 6C-1 is an electrical schematic of a multi-stage match line signal repeater circuit associated with two adjacent rows of CAM cells, according to an embodiment of the present invention.

FIG. 6C-2 is an electrical schematic that highlights a first stage of the match line repeater circuit of FIG. 6C-1.

DESCRIPTION OF PREFERRED EMBODIMENTS

Figure 1:
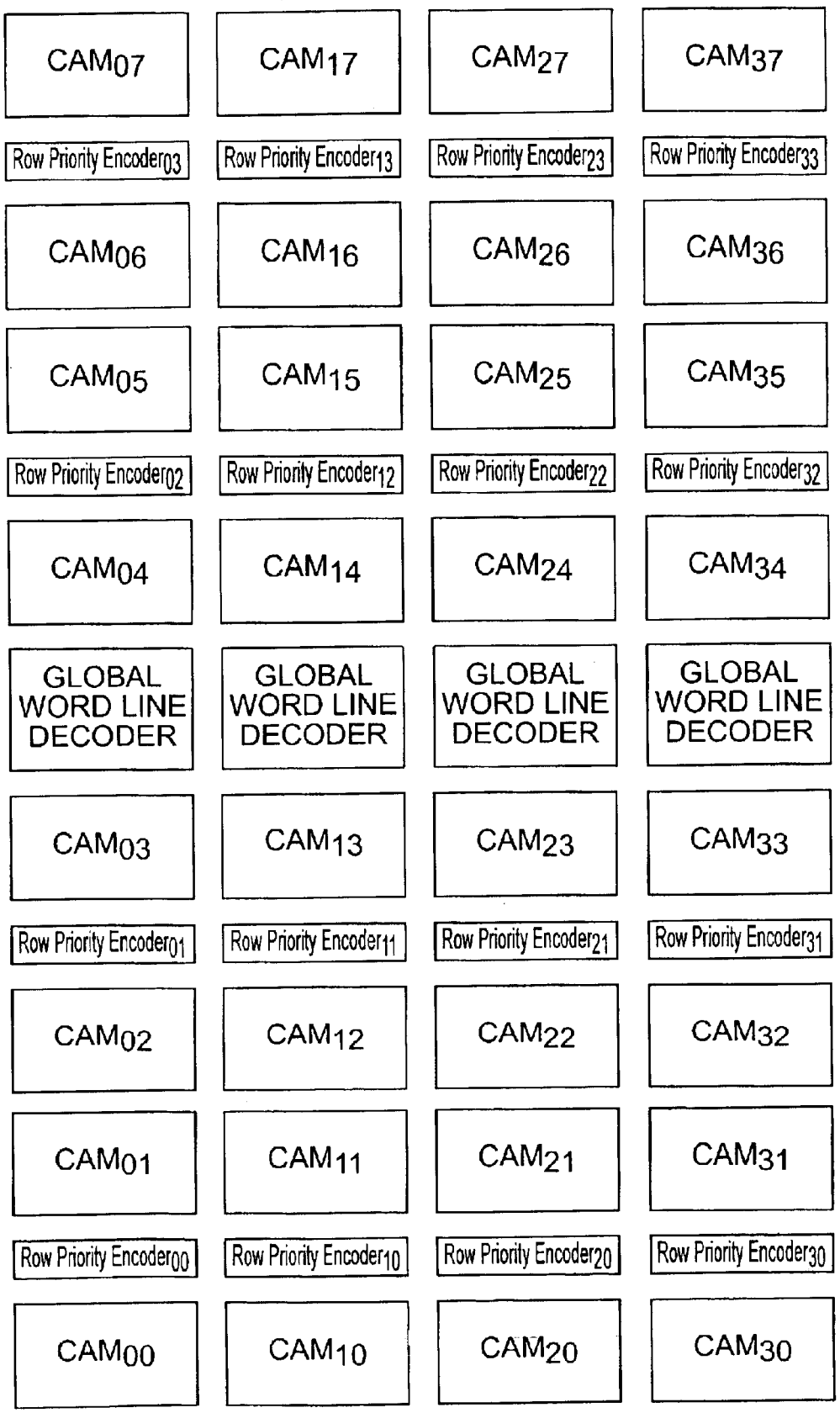
FIG. 1 is a block diagram of a content addressable memory (CAM) device having a plurality of CAM array blocks therein, according to the prior art.

The present invention now will be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout and signal lines and signals thereon may be referred to by the same reference characters. Signals may also be synchronized and/or undergo minor boolean operations (e.g., inversion) without being considered different signals. The suffix B (or prefix symbol "/") to a signal name may also denote a complementary data or information signal or an active low control signal, for example.

Figure 2A:
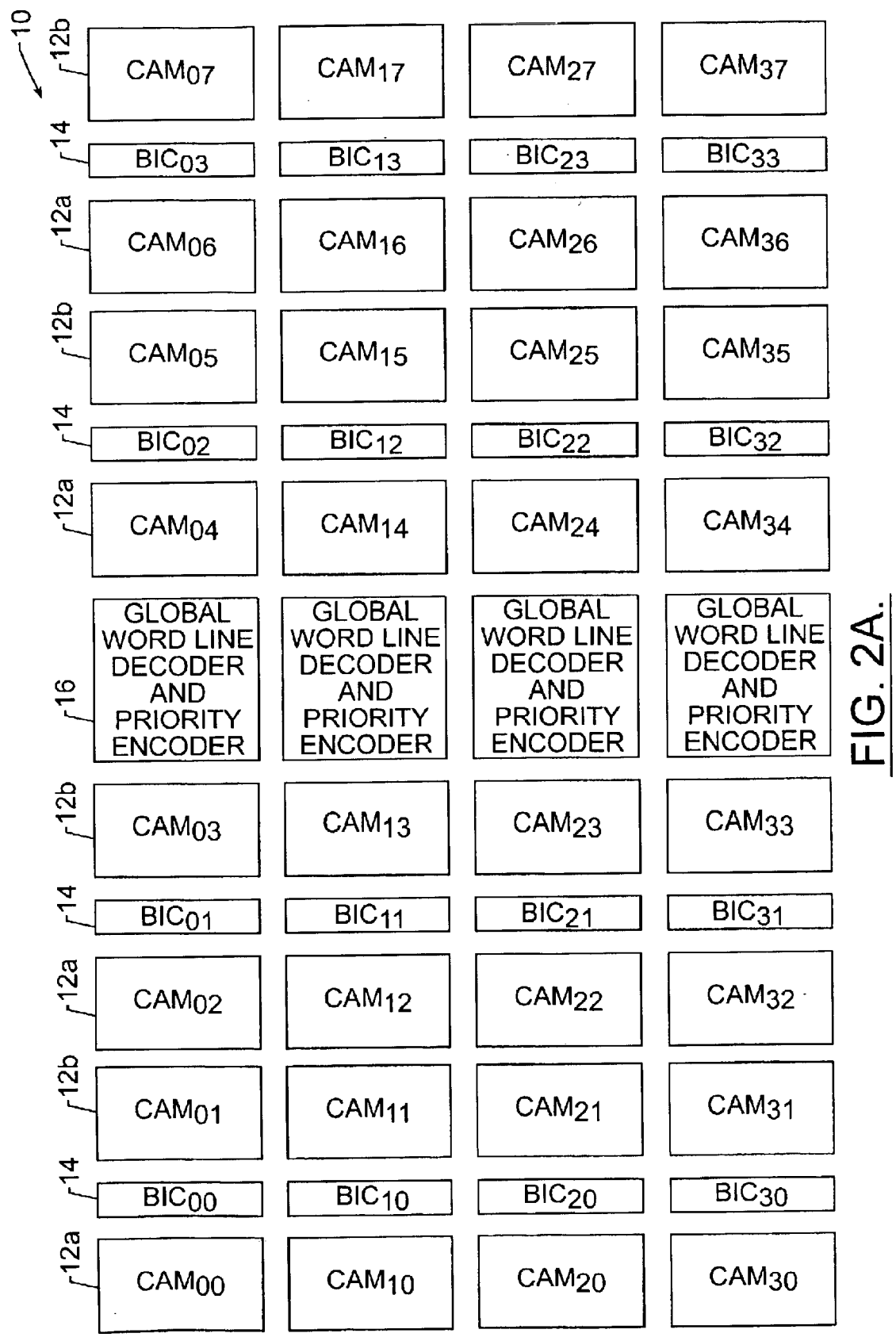
FIG. 2A is a block diagram of a multi-block content addressable memory (CAM) device according to an embodiment of the present invention.

Content addressable memory (CAM) devices according to embodiments of the present invention may include multiple CAM array blocks therein. As illustrated by FIG. 2A, preferred CAM devices 10 according to first embodiments of the present invention may include a plurality of CAM array blocks that are arranged by row and column, with each row of CAM array blocks including a left side tier of CAM array blocks and a right side tier of CAM array blocks that are arranged on opposing sides of a respective control circuit 16. The CAM array blocks are illustrated as being arranged in pairs. A separate control circuit 16 may be provided for each row of CAM array blocks, as illustrated. Each control circuit 16 may include, among other things, a global word line decoder and a priority encoder. The global word line decoder and priority encoder may be of conventional design. Each pair of CAM array blocks may be arranged as a left side CAM array block 12a and a right side CAM array block 12b.

For purposes of illustration only, the left side tier of CAM array blocks in the first row (row 0) includes four columns of CAM array blocks numbered as $CAM_{00}$–$CAM_{03}$. The right side tier of CAM array blocks in the first row also includes four columns of CAM array blocks numbered as $CAM_{04}$–$CAM_{07}$. In the second, third and fourth rows, the CAM array blocks on the left side and right side tiers are numbered as $CAM_{10}$–$CAM_{13}$, $CAM_{14}$–$CAM_{17}$, $CAM_{20}$–$CAM_{23}$, $CAM_{24}$–$CAM_{27}$, $CAM_{30}$–$CAM_{33}$ and $CAM_{34}$–$CAM_{37}$. Thus, the illustrated CAM device 10 includes 32 CAM array blocks that are arranged into 16 pairs. CAM devices 10 having high capacity typically include a larger number of CAM array blocks. For example, a CAM device 10 having 18 Meg capacity may include 512 CAM array blocks arranged as eight (8) left side tiers and eight (8) right side tiers, with each tier containing 32 CAM array blocks (i.e., 16 pairs of CAM array blocks). Each of these 512 CAM array blocks may have 512 normal rows and 8 redundant rows, with each row spanning 72 columns plus any redundant columns that may be configured to replace one or more defective main columns within a respective CAM array block. CAM devices 10 having redundant columns therein are more fully illustrated and described in U.S. application Ser. No. 10/084,842, to Lien et al., entitled "Content Addressable Memory (CAM) Devices Having Reliable Column Redundancy Characteristics and Methods of Operating Same," filed Feb. 27, 2002, the disclosure of which is hereby incorporated herein by reference.

The pairs of CAM array blocks in each tier of a high capacity CAM device 10 may be configured to support x72, x144, x288 and x576 search word lengths, for example. As described more fully hereinbelow, each pair of CAM array blocks may be configured to store a x144 entry as a x72 partial word in a row within a left block of a pair and a x72 partial word in a corresponding row within a right block of the pair. A x288 entry may be stored as first, second, third and fourth x72 partial words, with the first and third partial words being stored in consecutive rows in the left block of the pair and the second and fourth partial words being stored in corresponding rows in the right block of the pair. Finally, a x576 entry may be stored as first-eighth x72 partial words, with the first, third, fifth and seventh partial words being stored in four consecutive rows in the left block of a pair and the second, fourth, sixth and eighth partial words being stored in four consecutive rows in the right block of a pair. Alternatively, a x288 entry may be stored as first, second, third and fourth x72 partial words, with the first and second partial words being stored in corresponding rows within one pair of CAM array blocks and the third and fourth partial words being stored in corresponding rows within another pair of CAM array blocks. Similarly, a x576 entry may span corresponding rows in four pairs of CAM array blocks within a tier. Other arrangements for configuring long words may also be possible.

Figure 2B:
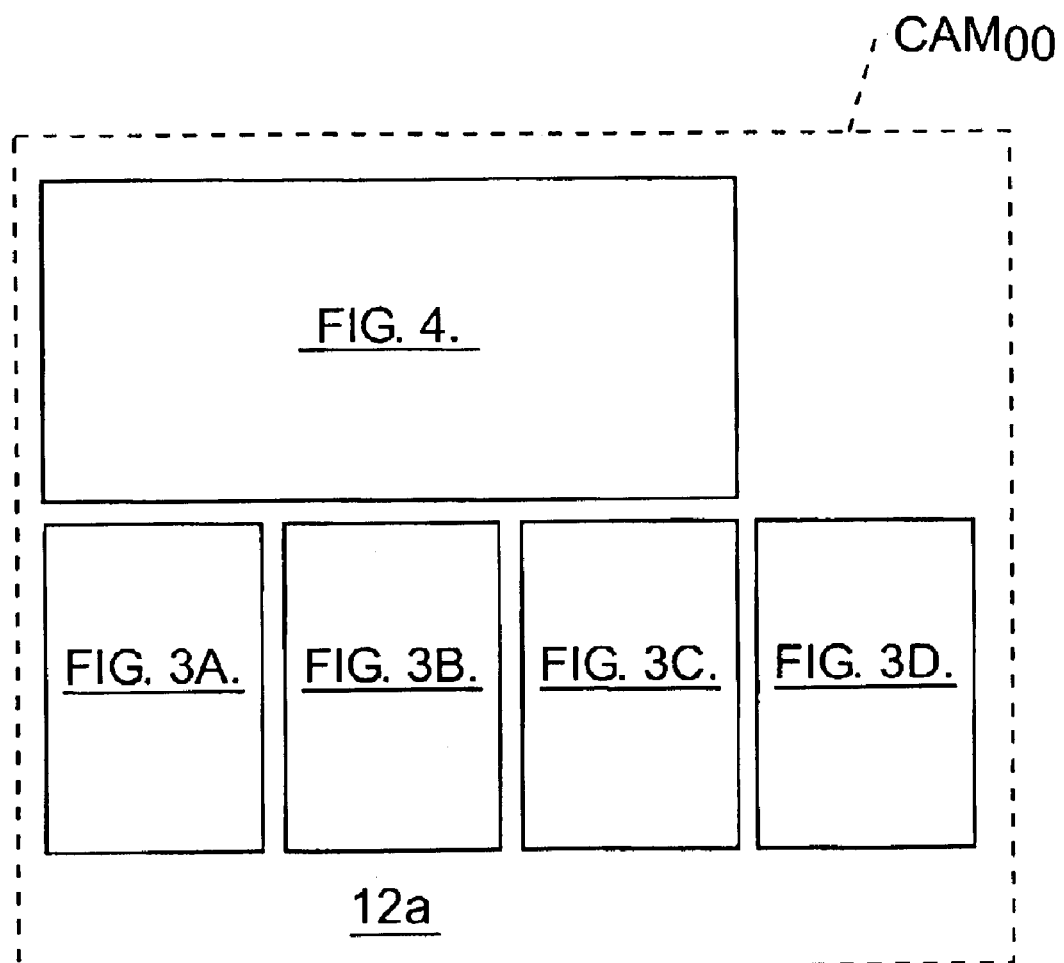
FIG. 2B is a block diagram illustrating the relative placement of the circuit elements of FIGS. 3A–3D and 4 within a CAM array block illustrated by FIG. 2A.

According to a preferred aspect of the illustrated CAM device 10, a respective bidirectional interface circuit 14 is provided between a left side CAM array block 12a and a right side CAM array block 12b in each pair of CAM array blocks. These bidirectional interface circuits 14 are numbered as $BIC_{00}$–$BIC_{03}$, $BIC_{10}$–$BIC_{13}$, $BIC_{20}$–$BIC_{23}$, $BIC_{30}$–$BIC_{33}$ in the first, second, third and fourth rows, respectively. Each of these bidirectional interface circuits 14 may be electrically coupled locally to the CAM array blocks 12a and 12b in a respective pair and also globally to a respective control circuit 16 within the same row. This global electrical coupling may be provided by, among other things, global word lines. The bidirectional interface circuits 14 and control circuits 16 are more fully illustrated and described in U.S. Provisional Application Serial No. 60/364,696, filed Mar. 15, 2002, entitled "Content Addressable Memory (CAM) Devices That Utilize Priority Class Detectors to Identify Highest Priority Matches in Multiple CAM Arrays and Methods of Operating Same," the disclosure of which is hereby incorporated herein by reference. A block diagram illustrating the relative placement of the circuit elements of FIGS. 3A–3D and 4 in the left side CAM array block $CAM_{00}$ is provided by FIG. 2B. The use of bidirectional interface circuits 14 may not be preferred when search, write and read operations are performed in an interleaved pipeline manner.

Referring to FIGS. 3A–3D and 4, a preferred arrangement and operation of a left side CAM array block 12a will now be described in detail. As described more fully hereinbelow, this CAM array block 12a may be included with other CAM array blocks of same or different design and/or may operate individually in a non-paired arrangement within a CAM device. The depth and/or width and/or orientation (left-to-right and/or top-to-bottom) of the illustrated CAM array block may also be modified to meet the requirements of a particular application. Moreover, the specific configuration of the illustrated CAM cells and match detection circuitry, bit line driver circuitry and sense amplifier circuitry described hereinbelow may be modified to meet the requirements of a particular application and layout, design or other requirements.

Figure 3A:
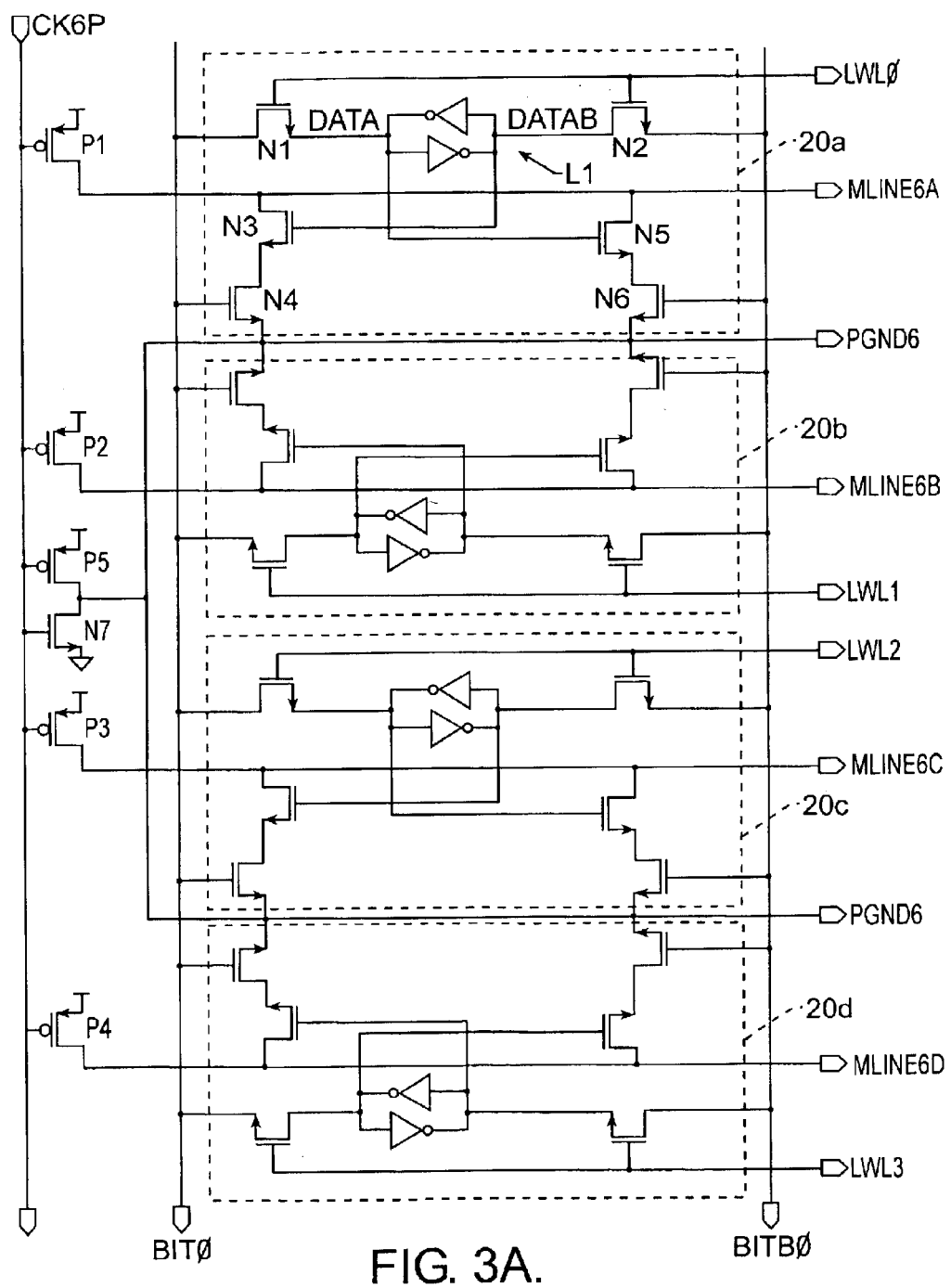
FIG. 3A is an electrical schematic that illustrates a quad group of rows of CAM cells in a first column of a CAM array block.

Referring now to FIG. 3A, the CAM array block 12a includes a first column of CAM cells that are electrically coupled to a first pair of differential bit lines, shown as bit lines BIT0 and BITB0 in column 0. As described herein, the bit line BIT0 represents a "true" bit line and the bit line BITB0, with the suffix "B", represents a "complementary" bit line. The illustrated column and each other column of CAM cells in the CAM array block 12a may include a plurality of normal, rows of CAM cells and one or more redundant rows of CAM cells. The redundant rows of CAM cells may be interspersed between the normal rows or provided as the lowermost or uppermost rows of the respective CAM array block 12a, for example. For purposes of discussion herein, the CAM array block 12a will be treated as including 512 normal rows, with each row being 72 bits wide (BIT0–BIT71). These depth and width designations may be chosen to meet a specific capacity and search word width requirements. The discussion herein also applies equally to redundant rows (not shown) in a CAM array block.

FIG. 3A also illustrates four CAM cells 20a–20d arranged in row order in the first column. The four CAM cells span four consecutive rows, shown as rows 0–3. First and second CAM cells 20a and 20b are illustrated as being mirror images of each other relative to a pseudo-ground line segment. Third and fourth CAM cells 20c and 20d are also illustrated as being mirror images of each other relative to a pseudo-ground line segment. As illustrated, the pseudo-ground line segment associated with the first and second CAM cells 20a and 20b and the pseudo-ground line segment associated with the third and fourth CAM cells 20a and 20b are part of a continuous first pseudo-ground line segment PGND6 that spans a first plurality of columns of the array. The use of the word "pseudo" when referring to a reference line that operates as a ground (GND) reference line when active, is meant to highlight the biasing of the reference line at a higher potential when inactive (e.g., positive potential of Vdd or (Vdd−Vth), where Vth is the threshold voltage of an NMOS transistor in a pull-up path that is active when the segment PGND6 is being precharged). Examples of CAM devices that utilize low match lines (LM) as pseudo-ground lines are more fully described in U.S. Pat. No. 6,262,907 to Lien et al., entitled "Ternary CAM Array," the disclosure of which is hereby incorporated herein by reference.

The first plurality of columns of CAM cells correspond to a first segment of the CAM array block 12a. The first segment of the CAM array block 12a is illustrated as having a length "L" equal to six (6). The length of the first segment of the CAM array block 12a may be chosen somewhat arbitrarily, but is preferably chosen to facilitate efficient search operations as described more fully hereinbelow. The length of the first segment of the CAM array block 12a may vary as a function of CAM depth and width. In alternative embodiments, the CAM cells in a fewer number or larger number of adjacent rows may share a common pseudo-ground line segment. It is also possible that each pseudo-ground line segment be dedicated to only CAM cells within the same segment of the same row.

Each of the CAM cells 20a–20d in FIG. 3A is illustrated as including first and second NMOS read/write access transistors N1 and N2, a latch L1 and cell compare circuitry. The gates of NMOS access transistors N1 and N2 are connected to a respective local word line, shown as LWL0–LWL3. The latch L1 retains stored data values (DATA, DATAB) and is illustrated as including a pair of inverters that are connected in antiparallel. As will be understood by those skilled in the art, the latch L1 and the first and second access transistors N1 and N2 may constitute an SRAM memory cell of conventional design. The cell compare circuitry is illustrated as comprising NMOS transistors N3–N6. NMOS transistors N4 and N6 have gate electrodes that are electrically coupled to the bit lines, shown as BIT0 and BITB0. During search operations, these bit lines provide data (e.g., bits of a search word) in the form of a comparand. In some applications, the gate electrodes of NMOS transistors N4 and N6 may be electrically coupled to a respective pair of comparand/data lines that may be independently controlled vis-a-vis the bit lines (BIT, BITB).

The drain terminals of NMOS transistors N3 and N5 within the cell compare circuitry are connected to a respective match line segment. Like the illustrated first pseudo-ground line segment PGND6, the first match line segments MLINE6A–MLINE6D illustrated in FIG. 3A also have a segment length of six (6), which means these match line segments span CAM cells in the first six (6) columns of the CAM array block 12a (i.e., columns 0–5). The source terminals of NMOS transistors N4 and N6 in the group of four consecutive rows of CAM cells are electrically coupled together by the first common pseudo-ground line segment PGND6, as illustrated. Each group of four consecutive rows of CAM cells will be referred to herein as a "quad" group. By assigning four consecutive rows of CAM cells into a respective quad group of rows and by linking the operation of each left side CAM array block 12a and right side CAM array block 12b in a respective pair together, x72, x144, x288 and x576 search operations can be implemented relatively easily. For example, a x576 search operation may be implemented by performing four consecutive x144 search operations (using both left and right side CAM array blocks in a pair) to determine whether any quad group of rows that span the left and right side CAM array blocks of a pair contains a matching x576 entry. Each of the four x144 search operations may include a x72 left side search operation during one lookup cycle and a x72 right side search operation during a subsequent lookup cycle. Thus, a x576 search operation may be implemented by performing eight (8) consecutive search operations that toggle from left-to-right and back four (4) times. Circuitry (not shown) may also be provided for passing the match line signals back and forth between the left side and right side CAM array blocks in a respective pair as the search operation progresses.

The CAM cells 20a–20d are illustrated as binary CAM cells, however they may also constitute ternary CAM cells that retain data and mask information. The CAM cells may be SRAM based, as illustrated, or DRAM based, for example. The CAM cells may also comprise nonvolatile memory elements. CAM array blocks having binary CAM cells and dedicated mask cells therein that retain global mask information may also be used. Such CAM array blocks are more fully illustrated and described in U.S. Provisional Application Serial No. 60/364,694, filed Mar. 15, 2002, entitled "Content Addressable Memory (CAM) Devices Having Dedicated Mask Cell Sub-Arrays Therein And Methods of Operating Same," the disclosure of which is hereby incorporated herein by reference. Ternary CAM cells that are configured as "lateral" cells are more fully described in the aforementioned application Ser. No. 10/084,842 to Lien et al. The compare circuitry in each CAM cell, shown as comprising NMOS transistors N3–N6, may also be modified to fit a particular application. For example, as described above, the drain of NMOS transistor N1 and the gate of NMOS transistor N4 may be electrically connected to a true bit line (as shown) and a true comparand line (not shown), respectively. Likewise, the source of NMOS transistor N2 and gate of NMOS transistor N6 may be electrically connected to a complementary bit line (as shown) and a complementary comparand/data line (not shown), respectively. The use of an additional pair of differential comparand lines for each column of CAM cells may facilitate the performance of simultaneous read and search operations and may reduce parasitic capacitive loading on the comparand lines, which are driven every search/lookup cycle. Nonetheless, for purposes herein, references to true or complementary bit lines or to differential bit lines will be interpreted to include lines that receive exclusively comparand data and lines that receive any combination of comparand data, read data and write data. References to bit lines will also be interpreted to include lines that are coupled to memory cells (and/or compare circuitry therein), but which do not require the use of differential data signals when being written to or read from.

As will be understood by those skilled in the art, if the illustrated first CAM cell 20a in FIG. 3A is storing a logic 1 data bit (i.e., DATA=1, DATAB=0) and the differential bit lines BIT0 and BITB0 in a first pair are pulled high (i.e., to a logic 1 level) and low (i.e., to a logic 0 level), respectively, to thereby represent application of a logic 1 bit of an applied search word during a search operation, then NMOS transistors N3 and N6 within the compare circuitry will be off and NMOS transistors N4 and N5 will be on. Based on this scenario of applied and stored data that match each other, neither the first serial electrical path provided by NMOS transistors N3 and N4 nor the second serial electrical path provided by NMOS transistors N5 and N6 will be conductive. Accordingly, the first CAM cell 20a will not operate to electrically "short" the first match line segment MLINE6A and the first pseudo-ground line segment PGND6 together.

However, if the illustrated first CAM cell 20a in FIG. 3A is storing a logic 0 data bit (i.e., DATA=0, DATAB=1) and the differential bit lines BIT0 and BITB0 are pulled high and low, respectively, during a search operation, then NMOS transistors N3 and N4 will be on and NMOS transistors N5 and N6 will be off. Based on this scenario of applied and stored data, which do not match each other, the first serial electrical path provided by NMOS transistors N3 and N4 will operate to electrically "short" the first match line segment MLINE6A and the first pseudo-ground line segment PGND6 together.

In this manner, the presence of a mismatch between the data stored within the first CAM cell 20a and the search bit applied to the first pair of differential bit lines BIT0 and BITB0, referred to herein as a "miss," will manifest itself as an electrical "short" in the first CAM cell 20a. This electrical short electrically connects the first match line segment MLINE6A to the pseudo-ground line segment PGND6 and operates to pull the first match line segment MLINE6A high-to-low, as explained more fully hereinbelow. This high-to-low transition of the match line segment MLINE6A may be referred to herein as a "miss" signal transition. In contrast, the presence of a "match" or "hit" between the data stored within the first CAM cell 20a and the search bit applied to the first pair of differential bit lines BIT0 and BITB0 will manifest itself as an electrical "open" within the first CAM cell 20a.

As illustrated by the PMOS pull-up transistors P1–P5 and the NMOS pull-down transistor N7 on the left side of FIG. 3A, the first x6 match line segments MLINE6A–MLINE6D and the first x6 pseudo-ground line segment PGND6 associated with the first quad group of rows can be precharged high in response to a leading edge (e.g., falling edge) of a first segment precharge clock signal CK6P for the first segment of the CAM array block. The first match line segments and first pseudo-ground line segments associated with the other quad groups of rows (not shown) can be pulled high in a similar fashion in-sync with the first segment precharge clock signal CK6P. To conserve power, the PMOS pull-up transistor P5 may be replaced by an NMOS pull-up transistor. In this case, the pseudo-ground line signal PGND6 will be precharged to a maximum voltage of Vdd−Vth, where Vth is a threshold voltage of the NMOS pull-up transistor. In this case, the gate electrode of the NMOS pull-up transistor may be responsive to an inverted version of CK6P.

A search of the contents of the CAM array block 12a may then continue with the triggering of a first portion of a search operation in-sync with the next following trailing edge (e.g., rising edge) of the first segment precharge clock signal CK6P. This trailing edge causes the first pseudo-ground line segments PGND6 within the CAM array block 12a to be pulled low by the NMOS pull-down transistor N7. This pull-down of the first pseudo-ground line segment PGND6 commences a multi-segment search operation. As explained more fully hereinbelow, if one or more entries within the CAM array block 12a match the applied search word, then, at the end of the search operation, the final match line segments associated with the rows containing the matching entries will remain high at their precharged levels and the final pseudo-ground line segments associated with these rows will be held low at discharged levels. In contrast, the final match line segments associated with non-matching entries will either be discharged to low levels or will remain precharged at high levels along with their corresponding pseudo-ground line segments. Thus, to determine whether an entry in a row is a matching entry at the end of a search operation, both the final match line and final pseudo-ground line segments associated with the rows should be evaluated.

Figure 3B:
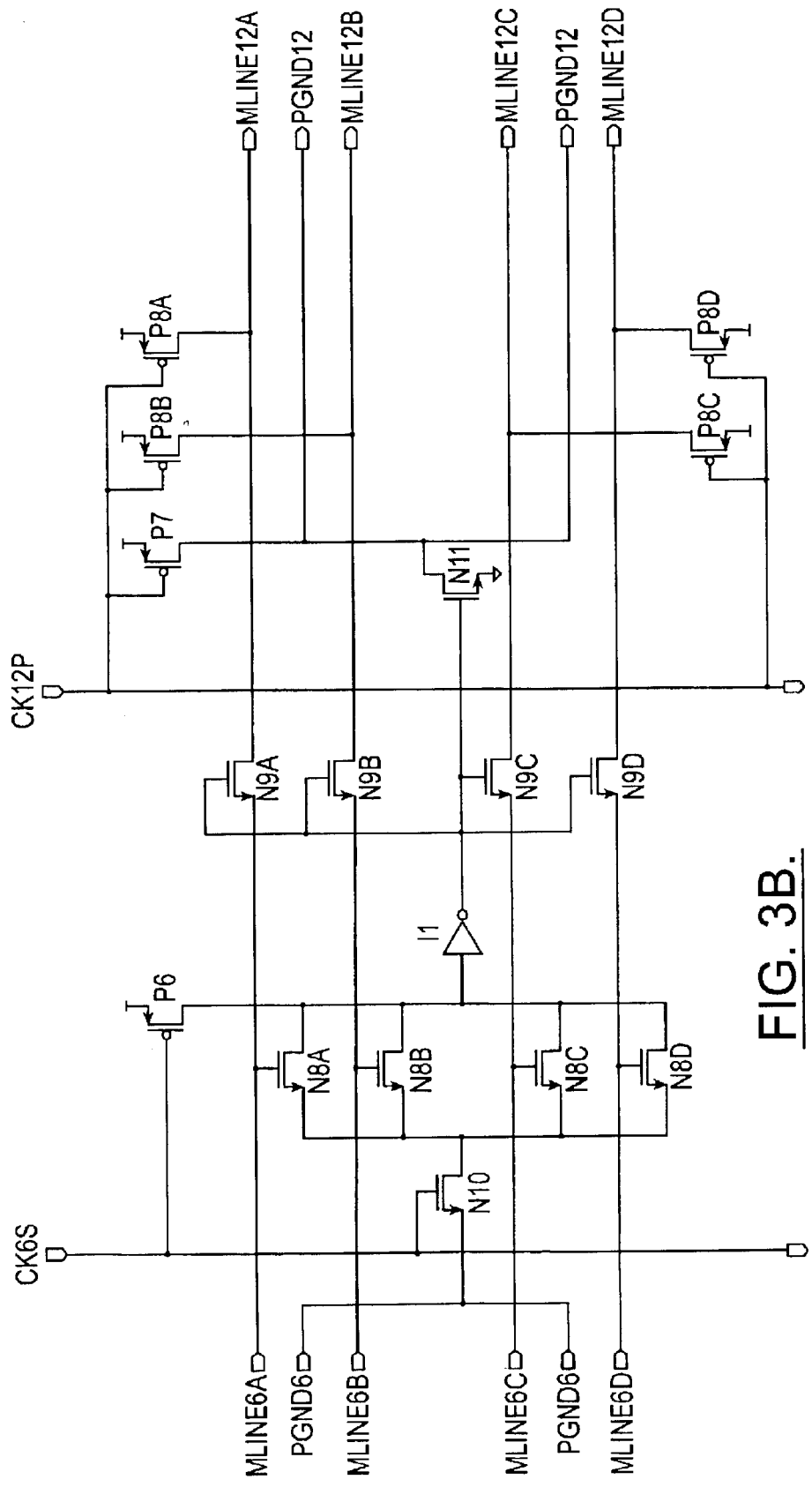
FIG. 3B is an electrical schematic that illustrates a portion of match line control circuit that links two segments of a CAM array block together and propagates match information therebetween, according to an aspect of the CAM device of FIG. 2A.
Figure 3C:
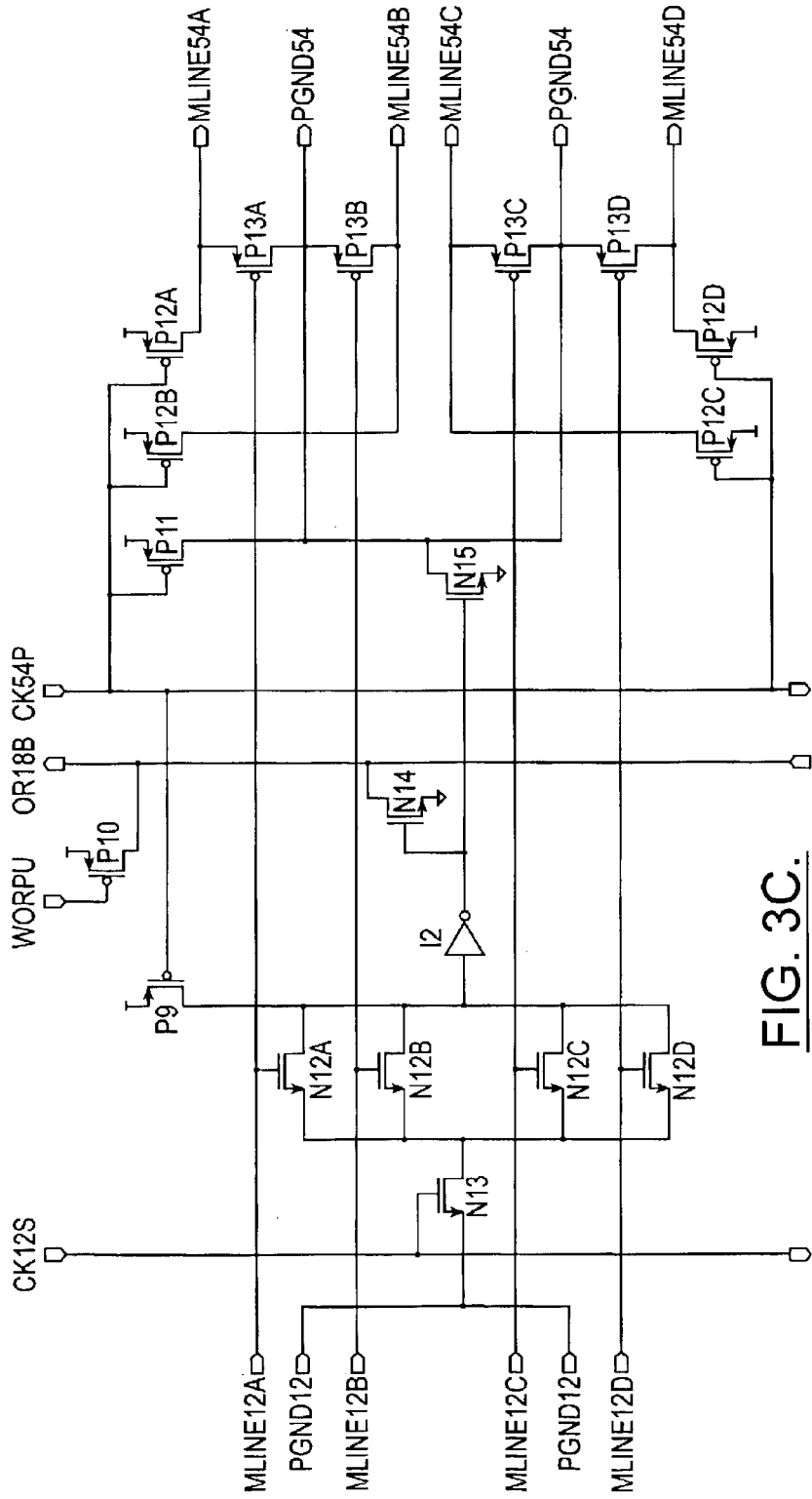
FIG. 3C is an electrical schematic that illustrates another portion of the match line control circuit that links two segments of a CAM array block together and propagates match information therebetween, according to an aspect of the CAM device of FIG. 2A.

Referring to FIGS. 3B–3C, the design and operation of a match line control circuit according to a preferred aspect of the CAM device 10 of FIG. 2A will now be described. In particular, a first portion of the match line control circuit illustrated by FIG. 3B passes match line and pseudo-ground line information from the first match line segments MLINE6A–MLINE6D and the first pseudo-ground segment PGND6 to the second match lines segments MLINE12A–MLINE12D and the second pseudo-ground line segment PGND12, respectively. Similarly, a second portion of the match line control circuit illustrated by FIG. 3C passes match line and pseudo-ground line information from the second match line segments MLINE12A–MLINE12D and the second pseudo-ground segment PGND12 to the third match line segments MLINE54A–MLINE54D and the third pseudo-ground line segment PGND54, respectively.

In the illustrated embodiment, the second match line and pseudo-ground line segments span 12 columns of CAM cells (e.g., columns 6–17) and the third match line and pseudo-ground line segments span 54 columns of CAM cells (e.g., columns 18–71). Thus, the first six columns of the CAM array block (shown as the six leftmost columns) represent the first segment of the CAM array block and the next twelve (12) columns of the CAM array block represent the second segment of the CAM array block. The last 54 columns of the CAM array block represent the third and final segment of the CAM array block.

In alternative embodiments, the first portion of the match detection circuitry may be eliminated by having the first match line and pseudo-ground line segments span the first 18 columns. The lengths of the match line and pseudo-ground line segments may be chosen somewhat arbitrarily, but are preferably chosen as a function of depth and width of the CAM array block. As described more fully hereinbelow, competing performance goals relating to search cycle time and power consumption may need to be balanced when selecting the number of segments and the sizes of the segments. For example, dividing the match and pseudo-ground line segments into too many short segments will typically increase the search cycle time to an unacceptably long interval. In contrast, dividing the match and pseudo-ground line segments into only two segments (one of which may be considerably longer than half the width of the CAM array block) may result in higher power consumption. If the CAM array block is relatively wide and other power saving techniques are not employed, then long match and pseudo-ground line segments may reduce search speed (e.g., a single-cell miss will take longer to discharge a match line to a detectable low level).

The rightmost ends of the first match line segments MLINE6A–MLINE6D and the rightmost end of the first pseudo-ground line segment PGND6 are illustrated by FIG. 3B. Six CAM cells (not shown) of a respective row segment are provided between each of the first match line segments MLINE6A–MLINE6D and corresponding portion of the first pseudo-ground line segment PGND6, which is shared by the four consecutive rows in a quad group. The rightmost ends of the first match line segments MLINE6A–MLINE6D are electrically coupled to the leftmost ends of the second match line segments MLINE12A–MLINE12D by pass transistors N9A–N9D, which are illustrated as NMOS pass transistors at the center of FIG. 3B. The gates of the NMOS pass transistors N9A–N9D are electrically connected together and to an output of an inverter I1. The input of the inverter I1 is precharged to a high level by operation of PMOS pull-up transistor P6. PMOS pull-up transistor P6 is responsive to a first segment strobe signal CK6S. This first segment strobe signal CK6S may transition high-to-low in response to (or at the same time as) a falling edge of the first segment precharge signal CK6P. The first segment strobe signal may then transition low-to-high after a rising edge of the first segment precharge clock signal CK6P has occurred.

The rising edge of the first segment precharge clock signal CK6P signifies commencement of a respective multi-segment search operation as the first pseudo-ground line segment PGND6 is pulled high-to-low by NMOS pull-down transistor N7, as illustrated by FIG. 3A. The first segment strobe signal CK6S is preferably synchronized with the first segment precharge clock signal CK6P. The delay between the rising edge of the first segment precharge clock signal CK6P and the corresponding rising edge of the first segment strobe signal CK6S may be of sufficient length to resolve whether any partial matches are present between a first segment of a new search word (provided on differential bit lines BIT0/BITB0–BIT5/BITB5) and corresponding portions of entries in the CAM array block. A second segment precharge clock signal CK12P is also provided for precharging the second match line segments MLINE12A–MLINE12D and the second pseudo-ground line segment PGND12. The precharging of the second match line segment MLINE12A–MLINE12D and second pseudo-ground line segment PGND12 is provided by PMOS pull-up transistors P8A–P8D and P7. In an alternative embodiment, the PMOS pull-up transistor P7 may be replaced with an NMOS pull-up transistor in order to conserve power. In this case, the pseudo-ground line signal PGND12 will be precharged to a maximum voltage of Vdd–Vth, where Vth is a threshold voltage of the NMOS pull-up transistor. The gate electrode of such an NMOS pull-up transistor may also be responsive to an inverted version of the second segment precharge clock signal CK12P. The second segment precharge clock signal CK12P may be switched high-to-low in-sync with a falling edge of the first segment precharge clock signal CK6P and may be switched high in-sync with a rising edge of the first segment strobe signal CK6S.

Accordingly, at the commencement of a multi-segment search operation, the drain of PMOS pull-up transistor P6 is pulled high, the output of the inverter I1 is set low and the NMOS pass transistors N9A–N9D are turned off to thereby electrically isolate the first and second match line segments from each other. However, once the first segment strobe signal CK6S transitions from low-to-high to thereby turn on pass transistor N10, the source terminals of NMOS pass transistors N8A–N8D are electrically connected in common to the first pseudo-ground line segment PGND6, which is held low by the NMOS pull-down transistor N7. At this point, if any of the first match line segments MLINE6A–MLINE6D associated with the first quad group of rows (e.g., rows 0–3) remains high at its precharged level, then a corresponding one (or more) of the pass transistors N8A–N8D will become conductive to thereby pull the input of the inverter I1 low and drive the output of inverter I1 high.

When the input to inverter I1 is pulled low, the output of inverter I1 is driven high and NMOS pass transistors N9A–N9D are all turned on. When NMOS pass transistors N9A–N9D are turned on, the high or low conditions of the first match line segments MLINE6A–MLINE6D are passed to the second match line segments MLINE12A–MLINE12D, subject only to the precondition that the first pseudo-ground line segment PGND6 has been pulled low and the first segment strobe signal CK6S has been driven high (and the pass transistor N10 is turned-on). Thus, if the first match line segment MLINE6A is low because one or more of the six CAM cells in the first row of the corresponding quad group of rows is indicating a miss condition with a respective bit(s) of the applied search word, then the second match line segment MLINE12A will also be pulled low by those same CAM cells (and possibly other CAM cells connected to the second match line segment MLINE12A in the event the second pseudo-ground line segment PGND12 is pulled low). Switching the output of inverter I1 from low-to-high also operates to turn on NMOS pull-down transistor N11. When NMOS pull-down transistor N11 turns on, the second pseudo-ground line segment PGND12 is pulled low from a precharged high level. This high-to-low transition of the second pseudo-ground line segment PGND12, which only occurs if at least one of the first match line segments MLINE6A–MLINE6D remains high to indicate at least one partial match condition in the respective quad group of rows, commences a second portion of the search operation relating to the second segment of entries in the CAM array block, which span columns 6–7 of the CAM array block.

Upon commencement of the second portion of the search operation, one or more of the second match line segments MLINE12A–MLINE12D may be pulled low by a respective one of the first match line segments MLINE6A–MLINE6D and/or by CAM cells connected to the second match line segments MLINE12A–MLINE12D. For example, the second match line segment MLINE12A may be pulled low by the first match line segment MLINE6A when pass transistor N9A is turned on and/or by one or more CAM cells that extend within the first row of the quad group of rows (e.g., row 0) and within a second segment of the CAM array block (i.e., columns 6–7 of the CAM array block).

According to a preferred aspect of the illustrated embodiment, the match line control circuit illustrated by FIG. 3B will not operate to pull the second pseudo-ground line segment PGND12 low from a precharged high level unless at least one partial match (i.e., x6 match) is indicated by one or more of the first match line segments MLINE6A–MLINE6D. Thus, in order for the second pseudo-ground line segment PGND12 to be pulled high-to-low, one or more of the first match line segments MLINE6A–MLINE6D must remain high as the search operation proceeds from the first segment to the second segment of the CAM array block.

On the contrary, if none of the first match line segments MLINE6A–MLINE6D remain high after the first pseudo-ground line segment PGND6 is pulled low at the commencement of the search operation, then all of the NMOS pass transistors N8A–N8D will be switched off. Accordingly, the input of inverter I1 will float high at its precharged level and NMOS pass transistors N9A–N9D and NMOS pull-down transistor N11 will remain off. So long as NMOS pull-down transistor N11 remains off, the second pseudo-ground line segment PGND12 will remain high at its precharged level and none of the second match line segments MLINE12A–MLINE12D will be pulled low because none of the pass transistors N9A–N9D will be conductive. Moreover, because the second pseudo-ground line segment PGND12 remains high, the CAM cells associated with the second match line segments MLINE12A–MLINE12D will be unable to pull down any respective match line segments. In other words, unless at least one partial match (i.e., x6 match) is detected within a quad group of rows associated with the first segment of the CAM array block, neither the second match line segments MLINE12A–MLINE12D nor the second pseudo-ground line segment PGND12 associated with the same quad group of rows will be pulled low from a precharged high level. In this manner, the charge required to discharge and then recharge these lines can be advantageously conserved in those cases where a x6 partial match is not detected in a respective quad group of rows.

The amount of charge that can be conserved may be substantial. For example, if the CAM array block is 512 rows deep (and contains exclusively binary CAM cells) and the entries in the block are assumed random, then a 1-in-64 chance of getting a x6 match ($2^6$=64) across the first segment of the CAM array block translates into eight (8) x6 partial matches (64×8=512). If it is assumed that each partial match is associated with a different quad group of rows, then only eight (8) of the second pseudo-ground line segments and only a maximum of 32 (8×4) of the second match line segments will be pulled high-to-low when the search operation passes from the first segment to the second segment of the CAM array block (i.e., when first segment strobe signal CK6S transitions from low-to-high to thereby turn on pass transistor N10). Thus, only eight (8) of the 128 second pseudo-ground lines segments PGND12 will be pulled low and only a maximum of 32 of the 512 second match line segments will be pulled low as the search operation passes from the first segment to the second segment. As will be understood by those skilled in the art, grouping more or less than four consecutive rows together will influence the amount of power savings that can be achieved and the amount of match line control circuitry required between the first and second segments of the CAM array block. Indeed, grouping more than four rows together may reduce the amount of match line control circuitry at the expense of higher power consumption. The decision to group a fewer or larger number of rows together may be constrained by maximum search word width requirements.

A second portion of the match line control circuit is provided between the second and third segments of the CAM array block, as illustrated by FIG. 3C. The match line control circuit illustrated by FIG. 3C is similar to the circuit illustrated by FIG. 3B, however, a different technique for coupling the second match line segments MLINE12A–MLINE12D to the third match line segments MLINE54A–MLINE54D is provided. The amount of charge that can be conserved using the second portion of the match detection circuitry to couple the second and third match line segments together during a search operation can be substantial. For example, the likelihood that a single x18 partial match (x6+x12) will be detected in a CAM array block that is 512 rows deep and contains random entries is 1-in-512 (512=262,144/512, where $2^{18}$=262,144). Thus, there is only a 4-in-512 (i.e., 1-in-128) chance that a quad group of rows in the third segment of the CAM array block will be enabled at the end of the second segment of the search operation.

The rightmost ends of the second match line segments MLINE12A–MLINE12D and the rightmost end of the second pseudo-ground line segment PGND12 are illustrated by FIG. 3C. The second match line segments MLINE12A–MLINE12D are coupled to gate electrodes of PMOS transistors P13A–P13D. PMOS transistor P13A operates to short third match line segment MLINE54A to the third pseudo-ground line segment PGND54 when the second match line segment MLINE12A is low and thereby indicates a miss condition. The other PMOS transistors P13B–P13D operate in a similar manner with respect to the other match line segments.

Twelve (12) CAM cells (not shown) of a respective row segment are provided between each of the second match line segments MLINE12A–MLINE12D and corresponding portion of the second pseudo-ground line segment PGND12. The input of the inverter I2 is precharged to a high level by operation of PMOS pull-up transistor P9. PMOS pull-up transistor P9 is responsive to a third segment precharge clock signal CK54P. The third segment precharge clock signal CK54P may be switched high-to-low in-sync with a falling edge of the first segment precharge clock signal CK6P and may be switched high-to-low in-sync with a rising edge of a second segment strobe signal CK12S. The second segment strobe signal CK12S may transition low-to-high after a rising edge of the first segment strobe signal CK6S has occurred. The second segment strobe signal CK12S is preferably synchronized with the first segment strobe signal CK6S. The delay between the rising edge of the first segment strobe signal CK6S and the corresponding rising edge of the second segment strobe signal CK12S should be of sufficient length to resolve whether any partial matches are present between a second segment of a new search word (provided on different bit lines BIT6/BITB6–BIT17/BITB17) and corresponding portions of entries in the CAM array block.

The third segment precharge clock signal CK54P is also provided for precharging the third match line segments MLINE54A–MLINE54D and the third segment pseudo-ground line PGND54. The precharging of the third match line segments MLINE54A–MLINE54D and the third segment pseudo-ground line PGND54 segment is provided by PMOS pull-up transistors P12A–P12D and P11. These pull-up transistors are also responsive to the third segment precharge clock signal CK54P.

The rising edge of the second segment strobe signal CK12S enables the start of a third portion of the search operation relating to the third segment of the CAM array block. Upon receipt of the rising edge of the second segment strobe signal CK12S, pass transistor N13 turns on. In response to the turn on of the pass transistor N13, the source terminals of NMOS transistors N12A–N12D are pulled low by the second pseudo-ground line segment PGND12 (which is pulled low by NMOS pull-down transistor N11). At this point, if any of the second match line segments MLINE12A–MLINE12D are high (thereby indicating at least one partial match (i.e., a x18 match) between the first and second segments of the CAM array block and the corresponding first and second segments of the applied search word), then at least one of the NMOS transistors N12A–N12D will be turned on and the input of the inverter I2 will be pulled high-to-low and the output of inverter I2 will be driven from low-to-high. The transition of the output of the inverter I2 from low-to-high will operate to turn on NMOS pull-down transistor N14. When NMOS pull-down transistor N14 turns on, signal line OR18B will be pulled low from a precharged high level. Signal line OR18B is initially precharged high by PMOS pull-up transistor P10. The size of this pull-up transistor P10 may be sufficient to service the entire length of the signal line OR18B. PMOS pull-up transistor P10 is responsive to a control signal, shown as signal WORPU (Wired-OR Pull-Up). Signal WORPU may be a relatively short duration active low pulse signal that may be triggered in response to a falling edge of the first segment precharge clock signal CK6P. In the illustrated embodiment, the signal line OR18B is a Wired-OR signal line that is electrically coupled to the drains of 128 NMOS pull-down transistors N14. Each of these NMOS pull-down transistors N14 is located within a respective one of 128 quad groups of rows. With respect to each quad group of rows, the drain terminal of each NMOS pull-down transistor N14 represents an output of a four input NOR logic gate having inputs that are represented by the gate electrodes of the NMOS pass transistors N12A–N12D. This NOR logic gate is enabled when the second pseudo-ground line segment PGND12 is low and the second segment strobe signal CK12S is high.

Based on the illustrated embodiment, the detection of any partial match through the first and second segments of any entry in the CAM array block will cause at least one of the 128 NMOS pull-down transistors N14 to turn on and thereby pull-down signal line OR18B from its precharged high level. The importance of signal line OR18B in facilitating a substantial reduction in power in the CAM array block will be described more fully hereinbelow with respect to the bit line driver circuit 40 of FIG. 4.

The detection of a partial match through the first and second segments of one of the four entries associated with the illustrated quad group of rows will also cause the NMOS pull-down transistor N15 to turn on. When NMOS pull-down transistor N15 turns on, then third pseudo-ground line segment PGND54 will be pulled low from a precharged high level. Once this pull-down of the third pseudo-ground line segment PGND54 occurs, match line information may be transferred from the second match line segments MLINE12A–MLINE12D to the third match line segments MLINE54A–MLINE54D. In particular, if the second match line segment MLINE12A is low at the time NMOS pull-down transistor N15 is turned on, thereby indicating a miss condition, then PMOS transistor P13A will become conductive. When PMOS transistor P13A becomes conductive, the third match line segment MLINE54A will be pulled low to the potential of the third pseudo-ground line segment PGND54 by the NMOS pull-down transistor N15. On the other hand, if the second match line segment MLINE12A is high at the time NMOS pull-down transistor N15, thereby indicating a partial match, then PMOS transistor P13A will remain off. Accordingly, if PMOS transistor P13A remains off, then a pull-down of the third match line segment MLINE54A will only occur if at least one CAM cell in the corresponding third segment of CAM cells (i.e., CAM cells connected to MLINE54A and PGND54) indicates a miss condition.

According to a preferred aspect of the match line control circuit of FIG. 3C, pass transistors, such as the NMOS pass transistors N9A–N9D of FIG. 3B, are not used to electrically connect the second match line segments MLINE12A–MLINE12D to the third match line segments MLINE54A–MLINE54D. Instead, the PMOS transistors P13A–P13D are used to improve the search speed by increasing the rate at which the third match line segments MLINE54A–MLINE54D are pulled low when a miss condition is present and NMOS pull-down transistor N15 turns on. Stated alternatively, PMOS transistors P13A–P13D provide "local" pull-down of the third match line segments MLINE54A–MLINE54D and eliminate the possibility that the third match line segments MLINE54A–MLINE54D, which may extend adjacent a right side of the CAM array block, will be pulled low by only one or a few CAM cells located adjacent a left side of the CAM array block. Thus, the possibility that a single CAM cell in column 0 may ultimately have to pull down an entire segmented match line (e.g., the series combination of MLINE6A, MLINE12A and MLINE54A) having a relatively large capacitance, is eliminated. For relatively narrow CAM array blocks, the use of PMOS transistors P13A–P13D may not be necessary and for relatively wide CAM array blocks, the coupling between the first match line segments MLINE6A–MLINE6D and the second match line segments MLINE12A–MLINE12D may require the use of PMOS transistors as well to provide local pull-down, such as the PMOS transistors P13A–P13D of FIG. 3C.

Figure 3D:
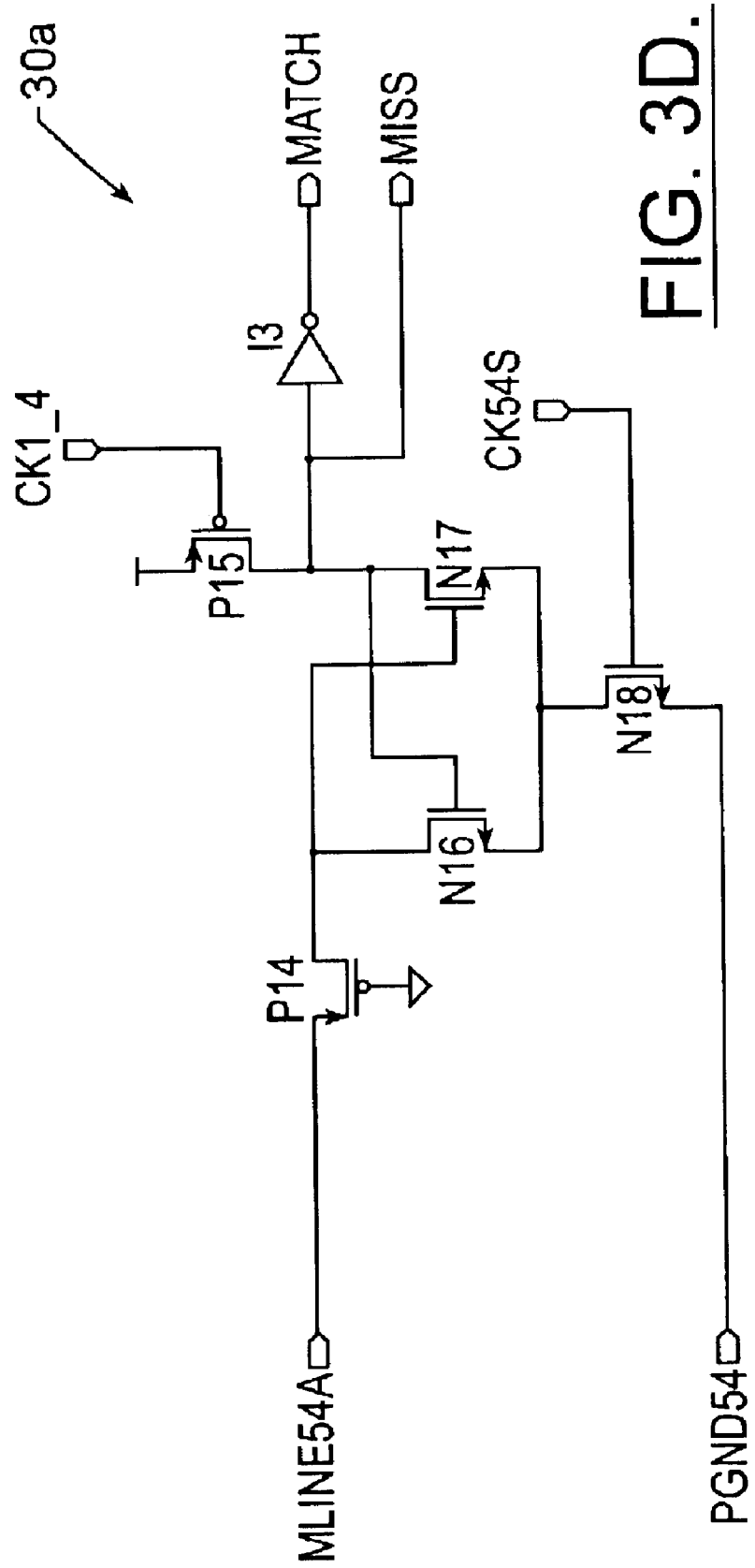
FIG. 3D is an electrical schematic of a match line sense amplifier according to an aspect of the CAM device of FIG. 2A.

Referring now to FIG. 3D, an electrical schematic of a preferred high speed and low power match line sense amplifier 30a will now be described. Each sense amplifier 30a has inputs that are coupled to a rightmost end of a respective one of the third match line segments and a respective third pseudo-ground line segment. The illustrated sense amplifier 30a has one input coupled to the third match line segment MLINE54A and a second input coupled to the corresponding third pseudo-ground line segment PGND54 associated with a first quad group of rows. The miss output MISS of the sense amplifier 30a is precharged high prior to a search operation by having the PMOS pull-up transistor P15 turn on in response to an active low clock signal, shown as CK1_4. This active low clock signal may be designed to transition from low-to-high shortly after (e.g., 1.5 ns after) the first segment precharge clock signal CK6P transitions from low-to-high to initiate commencement of the multi-segment search operation. The inverter I3 drives the match output MATCH of the sense amplifier 30a low in response to the precharge operation. The match output MATCH may be connected to a match condition line (not shown) associated with a priority class detector (not shown). The use of priority class detectors to identify a highest priority matching entry within a CAM array block is more fully described in aforementioned U.S. Provisional Application Serial No. 60/364,696.

PMOS pass transistor P14 is provided as a resistor to isolate the heavy capacitance loading of the respective third match line segment MLINE54A from the sensing circuit within the sense amplifier 30a. The use of a PMOS pass transistor P14 as a resistor is preferred relative to an NMOS pass transistor because the PMOS pass transistor P14 enables the gate of NMOS transistor N17 to be pulled to a full logic high level when the third match line segment MLINE54A is precharged high.

The sensing circuit is illustrated as including NMOS transistor N16 and NMOS transistor N17. These transistors are cross-coupled. NMOS transistor N16 is preferably designed to have a slightly higher threshold voltage relative to the NMOS transistor N17. The gate of NMOS transistor N17 is connected to the drain of the PMOS transistor (resistor) P14 and the drain of NMOS transistor N16. The gate of NMOS transistor N16 is connected to the drain of NMOS transistor N17 and the drain of the PMOS pull-up transistor P15. The sources of NMOS transistors N16 and N17 are electrically connected together and to the drain of NMOS pull-down transistor N18, which operates as an enable transistor.

The sense amplifier 30a is responsive to a third segment strobe signal CK54S. This third segment strobe signal CK54S drives a gate of the NMOS pull-down transistor N18. The third segment strobe signal CK54S is preferably generated in-sync with a rising edge of the second segment strobe signal CK12S. The delay between the rising edge of the second segment strobe signal CK12S and the rising edge of the third segment strobe signal CK54S is set to provide sufficient time for the third match line segment MLINE54A to be pulled low in the event the corresponding entry does not match the applied search word.

The sense amplifier 30a provides very low dynamic power consumption because the pull-down path provided through NMOS transistors N16, N17 and N18 cannot become conductive unless the third pseudo-ground line segment PGND54 has been pulled low (by NMOS pull-down transistor N15 illustrated by FIG. 3C) by the presence of at least one x54 match associated with the corresponding quad group of rows. In the event no partial matches have been detected through the first and second segments of the quad group of rows, then the third pseudo-ground line segment PGND54 will not be pulled low and the match output MATCH will remain low and the miss output MISS will remain high at its precharged level.

However, if the entry associated with the illustrated third match line segment MLINE54A matches the applied search word, then the gate of NMOS transistor N16 and the gate of NMOS transistor N17 will both be high and the third pseudo-ground line segment PGND54 will be discharged to a low level. When this occurs, an inversion layer channel formed within the NMOS transistor N17 will be more highly conductive than the inversion layer channel formed within the opposing NMOS transistor N16 in the cross-coupled pair because NMOS transistor N16 has a slightly higher threshold voltage than NMOS transistor N17. Accordingly, when the third segment strobe signal CK54S transitions low-to-high and the NMOS pull-down transistor N18 turns on, a pull-down race will occur between NMOS transistors N16 and N17. In particular, NMOS transistor N17 will operate to pull-down the gate of the NMOS transistor N16 from its precharged high level faster than the NMOS transistor N16 can pull-down the gate of NMOS transistor N17 from its precharge high level. This race condition will cause NMOS transistor N16 to turn off and NMOS transistor N17 to turn on fully and pull the miss output MISS of the sense amplifier 30a low. When the miss output MISS of the sense amplifier 30a is pulled low, the match output MATCH will be driven high by the inverter I3 to indicate that a matching entry is present in the corresponding row of the CAM array block.

Finally, if the third pseudo-ground line segment PGND54 is pulled low to indicate at least one partial match (i.e., at least one x18 match) in the respective quad group of rows, but the third match line segment MLINE54A is also pulled low to indicate a miss associated with the respective entry, then NMOS transistor N17 will be turned off when NMOS pull-down transistor N18 is turned on in response to the third segment strobe signal CK54S. NMOS transistor N16 will also be turned on because the drain of PMOS transistor P15 will be floating high at its precharged level. Based on these conditions, the miss output MISS of the sense amplifier 30a will remain high at its precharged level and the match output MATCH will remain low to thereby indicate a miss condition. Here, again, the sense amplifier 30a will consume little dynamic current when the third segment strobe signal CK54S is switched high. This is because the conductive path provided by NMOS transistor N16 and NMOS pull-down transistor N18 will extend between two signal lines that are both held at the same potential.

Figure 4:
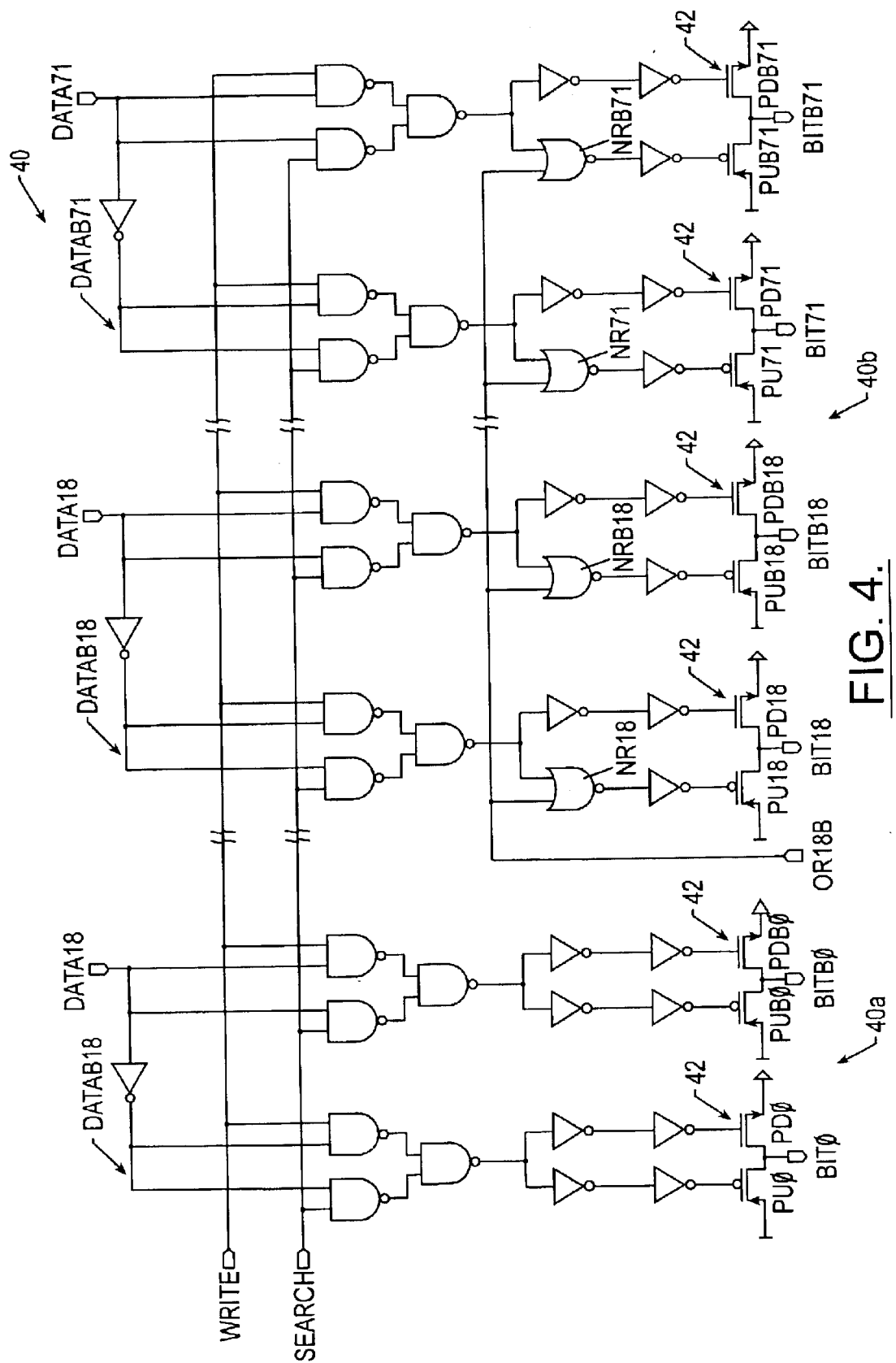
FIG. 4 is an electrical schematic of a bit line driver circuit according to an aspect of the CAM device of FIG. 2A.

Referring now to FIG. 4, a preferred bit line driver circuit 40 will be described. The bit line driver circuit 40 is divided into a first portion 40a and a second portion 40b. The first portion 40a of the bit line circuit 40, which drives the first eighteen (18) pairs of differential bit lines BIT0/BITB0–BIT17/BITB17, is of conventional design. The first portion 40a uses a two tier arrangement of NAND gates, shown as two-to-one, to pass input data DATA0–DATA17 received by the CAM array block to the first 18 pairs of differential bit lines. As will be understood by those skilled in the art, setting either the search signal line SEARCH high during a search operation or the write signal line WRITE high during a write operation, will pass the input data to the CMOS drivers 42 associated with each true and complementary bit line associated with the first eighteen pairs of differential bit lines. For example, if the first bit of the input data (i.e., DATA0) is set high, then PMOS pull-up transistor PU0 within a first CMOS driver 42 will be turned on and NMOS pull-down transistor PD0 will be turned off, which means the first true bit line BIT0 will be pulled high. PMOS pull-up transistor PUB0 of the adjacent CMOS driver 42 will also be turned off and NMOS pull-down transistor PDB0 will be turned on, which means the first complementary bit line BITB0 will be pulled low.

The second portion 40b of the bit line driver circuit 40 is similar to the first portion 40a, however, NOR gates NR18/NRB18–NR71/NRB71 are provided so that neither the true nor the complementary bit line within a pair of bit lines associated with the third segment of columns in the CAM array block (columns 18–71) can be actively driven high while the signal line OR18B remains high at its precharged level. In other words, until such time as signal line OR18B is pulled low by the Wired-Or circuitry illustrated by FIG. 3C, none of the PMOS pull-up transistors PU18/PUB18–PU71/PU71 associated with the third segment of columns of CAM cells in the CAM array block can be made conductive to actively pull-up a respective true or complementary bit line. Instead, only two output states are provided by the CMOS drivers 42 in the second portion 40b of the bit line driver circuit 40 while signal line OR18B is maintained at its precharged high level. These two states include a high impedance state and a pull-down state. Stated alternatively, the second portion 40b of the bit line driver circuit 40 will apply data to the true and complementary bit lines BIT18/BITB18–BIT71/BITB71 by floating or pulling down these bits lines so long as signal line OR18B is maintained at its precharged high level. Nonetheless, once signal line OR18B is pulled low, thereby indicating that at least one partial match has been detected (i.e., at least one x18 match has been detected) during the second segment of the search operation, the NOR gates NR18/NRB18–NR71/NRB71 will operate as inverters and the operation of the second portion 40b of the bit line driver circuit 40 will match the operation of the first portion 40a of the bit line driver circuit 40. When this occurs, the CMOS drivers 42 associated with the third segment of the differential bit lines (i.e., BIT18/BITB18–BIT71/BITB71) will perform both pull-up and pull-down operations in a conventional manner.

The operation of the bit line driver circuit 40 of FIG. 4 is illustrated by TABLE 1 below. In TABLE 1, the first column under the heading "WRITE" illustrates how low and high data values (DATA) are passed as differential signals to the true and complementary bit lines (BIT, BITB), while signal line OR18B is maintained at a high level. The second column, under the heading "SEARCH(x18)", illustrates how the second portion 40b of the bit line driver circuit 40 controls the true and complementary bit lines associated with the third segment of columns of CAM cells, prior to detection of at least one partial match (e.g., x18 match). This control is provided by actively and selectively pulling down or floating each true and complementary bit line in a manner that conserves power by preventing unnecessary switching of bit lines in the event at least one partial match is not detected in the x18 segment (x6+x12 segment) of the CAM array block.

TABLE 1

|  | WRITE | | SEARCH (x 18) | | SEARCH (x54) | |
| --- | --- | --- | --- | --- | --- | --- |
| DATA18-71 | L | H | L | H | L | H |
| WRITE | H | H | L | L | L | L |
| SEARCH | L | L | H | H | H | H |
| OR18B | L | L | H | H | L | L |
| BIT18-BIT71 | L | H | L | FLOAT | L | H |
| BITB18-BITB71 | H | L | FLOAT | L | H | L |

To illustrate more fully, if bit 18 of a new search word received at the DATA input of the bit line driver circuit 40 is at a logic high level, then the true bit line BIT18 will be floated (low or high) by disposing the output of the corresponding CMOS driver 42 in a high impedance state and the complementary bit line BITB18 will be pulled low. In contrast, if bit 18 of the applied search word received at the DATA input of the bit line driver circuit 40 is at a logic low level, then the complementary bit line BITB18 will be floated (low or high) by disposing the output of the corresponding CMOS driver 42 in a high impedance state and the true bit line BIT18 will be pulled low.

As described herein, floating a true bit line high and pulling a corresponding complementary bit line low when the corresponding input data bit is high is equivalent to applying a corresponding bit of a previous "old" search word that was high to the true bit line. However, actively pulling a true bit line low and floating a corresponding complementary bit line low when the corresponding input data bit is low is equivalent to applying a global mask bit to the true and complementary bit lines. In other words, if an old data bit residing on a respective differential pair of bit lines is high (BIT=high, BITB=low) and the corresponding new data bit received by the bit line driver circuit 40 is high, then the second portion 40b of the bit line driver circuit 40 will continue to apply the old data bit to the differential pair of bit lines while signal line OR18B is maintained at its precharged high level. Alternatively, if the old data bit residing on a respective differential pair of bit lines is high or low and the corresponding new data bit received by the bit line driver circuit 40 is different from the old data bit, then the second portion 40b of the bit line driver circuit 40 will apply mask bits to the differential pair of bit lines while signal line OR18B is maintained at its precharged high level. As described herein, "applying" a first bit to a signal line includes floating or actively driving the signal line at a level (high or low) that corresponds to a logic level of the first bit.

Finally, the third column of TABLE 1, under the heading "SEARCH(x54)", illustrates how the second portion 40b of the bit line driver circuit 40 controls the true and complementary bit lines associated with the third segment of columns of CAM cells, after detection of at least one partial match (e.g., at least one x18 match). As illustrated by FIG. 4, if signal line OR18B switches from high-to-low to thereby indicate the detection of at least one partial match in any of the rows of the CAM array block, then the second portion 40b of the bit line driver circuit 40 will operate in a conventional manner to drive the bit lines associated with the third segment of CAM cells with the new data.

Nonetheless, at the moment the signal line OR18B is pulled high-to-low (to indicate detection of at least one partial match) and the third segment of the search operation is commenced, the logic levels on the third segment of bit lines (i.e., BIT18/BITB18–BIT71/BITB71) will either match the logic levels of the new data bits to be applied to the bit lines or will match logic levels corresponding to global mask bits. Thereafter, when any and all floating bit lines are actively pulled high from a floating high state or pulled low from a floating low state, or whenever any and all bit lines that are actively pulled low but need to be high to represent the new data levels, are switched low-to-high, the third segment search operation may continue without generating errors that might occur during conventional search operations when bit lines are switched part-way through a search operation.

The second portion 40b of the bit line driver circuit 40 may also be configured to actively pull each true and complementary bit line to a logic 0 level (indicating a global mask condition) for all bit lines associated with the third segment of the CAM array block, before the third segment of the search operation commences. However, actively driving all the bit lines associated with the third segment of the CAM array block with mask data may result in unnecessary power consumption because many if not most of these bit lines will ultimately need to be driven back to high logic levels when signal line OR18B switches high-to-low to indicate that at least one x18 partial match has been detected.

Alternatively, the second portion 40b of the bit line driver circuit 40 may actively drive some of the pairs of bit lines with mask bits and actively drive selected others with new data bits in the event these new data bits match the old data bits residing on the bit lines. This alternative embodiment provides many of the power saving advantages achieved by the driver circuit 40 of FIG. 4, and may achieve an additional advantage of having higher reliability during a search operation by preventing compare errors that may occur if one or more floating bit lines is erroneously pulled to an opposite logic level through capacitive coupling to adjacent signal lines undergoing switching. Nonetheless, this latter embodiment may require somewhat more complicated driver circuitry relative to the driver circuit of FIG. 4. The driver circuit 40 of FIG. 4 may also be modified to provide a column redundancy feature, as described more fully in the aforementioned U.S. application Ser. No. 10/084,842, to Lien et al.

Figure 5:
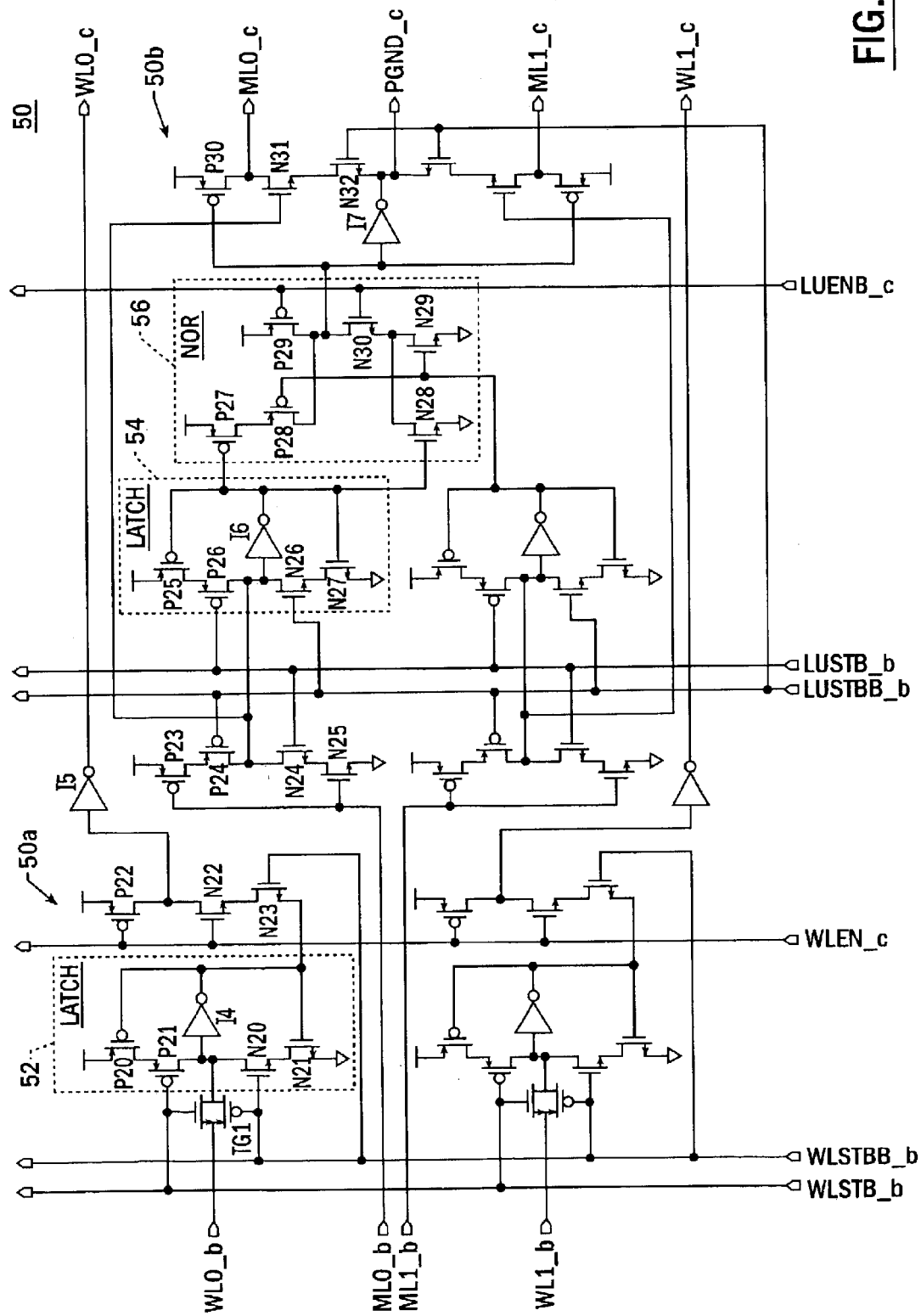
FIG. 5 is an electrical schematic of a segment-to-segment word line and match line interface circuit and word line control circuit according to an embodiment of the present invention.

Referring now to FIG. 5, an electrical schematic of segment-to-segment match line and word line interface circuit 50 that supports pipelined write/read operations and pipelined search operations within a CAM device will be described. These pipelined write/read and search operations typically span multiple clock cycles. The interface circuit 50 includes a segment-to-segment word line control circuit 50a and a segment-to-segment match line control circuit 50b that supports selective discharge operations. The word line control circuit 50a has an input that is electrically connected to a lower word line segment, shown as WL0_b, and an output that is electrically connected to an upper word line segment, shown as WL0_c. The lower word line segment WL0_b may span a first plurality of columns of CAM cells in row 0 of a CAM array and the upper word line segment WL0_c may span a second plurality of columns of CAM cells in row 0. For example, if the CAM array has a logical width of 72 columns, then the lower word line segment WL0_b may span columns 6–17 of a CAM array and the upper word line segment WL0_c may span columns 18–71 of the CAM array. An initial word line segment WL0_a (not shown in FIG. 5) may also span columns 0–5 of the CAM array. This initial segment may be separated from the word line segment WL0_b by an interface circuit that is similar to the one illustrated by FIG. 5. CAM arrays having different segment lengths and logical widths are also possible. Each of the illustrated word line segments is typically connected to gate terminals of a pair of access transistors associated with each CAM cell in a respective row segment of the CAM array (see, e.g., NMOS access transistors N1 and N2 in FIG. 3A).

During a pipelined segment-to-segment write (or read) operation, an active high word line signal WL0_b at the input of the word line control circuit 50a passes through a CMOS transmission gate TG1, which is responsive to a pair of complementary word line strobe signals WLSTB_b and WLSTBB_b (for segment b). The true word line strobe signal WLSTB_b is an active high signal and the complementary word line strobe signal WLSTBB_b is an active low signal. These strobe signals may be generated in-sync with a clock signal that controls the timing of the pipelined write (or read) operations. A latch 52 is also provided for latching the active high word line signal WL0_b. This latch 52 is illustrated as including PMOS pull-up transistors P20 and P21, NMOS pull-down transistors N20 and N21 and an inverter I4. This latch 52 operates in a conventional manner when PMOS pull-up transistor P21 and NMOS pull-down transistor N20 are enabled by trailing edges of the word line strobe signals WLSTB_b and WLSTBB_b (i.e., when WLSTB_b=0 and WLSTBB_b=1). During an operation to write (read) an entry into (from) row 0 of the CAM array, an active high word line signal WL0_b at the input of the segmented word line control circuit 50a will be latched as an active low signal at an output of inverter I4 when the true word line strobe signal WLSTB_b switches high-to-low and the complementary word line strobe signal WLSTBB_b switches low-to-high. Then, upon receipt of an active high word line enable signal WLEN_c during a next stage of the pipelined write operation (when WLSTBB_b is high), the active low signal at the output of the inverter I4 is passed through NMOS transistors N22 and N23 and inverter I5 as an active high signal to the upper word line segment WL0_c. As illustrated, the output of the inverter I4 is connected to a source of NMOS transistor N23. NMOS transistor N23 has a gate that receives the complementary word line strobe signal WLSTBB_b. A PMOS pull-up transistor P22 is provided for holding the upper word line segment WL0_c at an inactive low level when the word line enable signal WLEN_c is inactive at a low level. The NMOS transistor N22 is turned off when the PMOS pull-up transistor P22 is turned on.

Accordingly, a pipelined segment-to-segment write (or read) operation on row 0 includes passing an active high word line signal from a lower word line segment WL0_b to an upper word line segment WL0_c in response to (i) an active high true word line strobe signal WLSTB_b and (ii) an active high true word line enable signal WLEN_c, which may have a leading edge that occurs in-sync with an inactive high-to-low transition of the true word line strobe signal WLSTB_b. A pipelined segment-to-segment write (or read) operation on row 1 may include passing an active high word line signal from a lower word line segment WL1_b to an upper word line segment WL1_c in a similar fashion. In this manner, a word having a logical width of x72bits may be written into a designated row of CAM cells in a segment-to-segment manner during a pipelined write operation that spans a plurality of clock signals. This designated row may be specified by a write address in a conventional manner. For example, the x72 word may be written during a pipelined sequence of write operations that includes writing a x6 segment, a x12 segment and a x54 segment of a x72 word during three consecutive stages of a write operation. Likewise, a word having a logical width of x72 bits may be read from a row of CAM cells during a read operation that spans three consecutive stages of a pipelined read operation. As illustrated by TABLES 2 and 3A–3B, which are described more fully hereinbelow, these pipelined segment-to-segment write (or read) operations may be closely interleaved with pipelined segment-to-segment search operations in order to reduce or prevent the occurrence of pipeline bubbles that typically limit operating efficiency.

The match line control circuit 50b of FIG. 5, which receives a pair of lower match line signals ML0_b and ML1_b, may be active during each pipelined segment-to-segment search operation. The match line control circuit 50b generates a pair of upper match line signals ML0_c and ML1_c and an upper pseudo-ground line signal PGND_c that is shared by two rows of CAM cells (shown as row 0 and row 1). Accordingly, if the CAM array has a logical depth of 512 rows, then the match line control circuit 50b of FIG. 5 will need to be reproduced 255 additional times in a vertical column that spans the 512 rows of the CAM array.

As will become apparent by the following description of the segmented match line control circuit 50b, the upper match line signals ML0_c and ML1_c and the upper pseudo-ground line signal PGND_c will all be precharged high in-sync with a trailing low-to-high edge of an active low look-up enable signal LUENB_c, whenever either (or both) of the lower match line signals ML0_b or ML1_b is high at the end of a preceding stage of the pipelined search operation. However, the upper match line signals ML0_c and ML1_c and the upper pseudo-ground line signal PGND_c will not be precharged high if both of the pair of lower match line signals ML0_b and ML1_b are low at the end of the preceding stage of the pipeline search operation. In this manner, the match line control circuit 50b performs selective match line precharge operations.

An upper half of the match line control circuit 50b, which is labeled with reference numbers, will now be described. The lower half of the match line control circuit 50b operates in an identical manner and need not be described further herein. The upper half of the control circuit 50b includes a four transistor (4T) inverter, a latch 54 and boolean logic that is configured to perform the function of a two-input NOR gate 56. This NOR gate 56 has a control terminal that is responsive to the look-up enable signal LUENB_c. The 4T inverter includes PMOS pull-up transistors P23 and P24 and NMOS pull-down transistors N24 and N25, connected in series in a totem pole arrangement. An input of the 4T inverter is connected to the lower match line segment ML0_b. The 4T inverter becomes active in response to a leading edge of an active high true look-up strobe signal LUSTB_b and a leading edge of an active low complementary look-up strobe signal LUSTBB_b. The true look-up strobe signal LUSTB_b may be generated as a relatively short duration logic 1 pulse and the complementary look-up strobe signal LUSTBB_b may be generated as a relatively short duration logic 0 pulse at an output of an inverter (not shown) that receives the true look-up strobe signal LUSTB_b as an input signal. An output of the 4T inverter is connected to an input of the latch 54, which includes PMOS pull-up transistors P25 and P26, NMOS pull-down transistors N26 and N27 and an inverter I6. When the 4T inverter is active, an active high lower match line signal ML0_b will cause the inverter I6 to generate (or sustain) a logic 1 signal, which is passed to a first input of the NOR gate 56. This logic 1 signal at the output of inverter 16 will become latched when the true look-up strobe signal LUSTB_b switches high-to-low and the complementary look-up strobe signal LUSTBB_b switches low-to-high.

The NOR gate 56 includes PMOS pull-up transistors P27 and P28 and NMOS pull-down transistors N28 and N29 that receive a pair of input signals. The NOR gate 56 also includes a PMOS pull-up transistor P29 that operates to pull-up an output of the NOR gate 56 in-sync with a leading high-to-low edge of the look-up enable signal LUENB_c. An NMOS transistor N30 is also provided for enabling the NOR gate 56 in-sync with a trailing low-to-high edge of the look-up enable signal LUENB_c. The output of the NOR gate 56 is provided to an input of an inverter I7 and to a pair of PMOS precharge transistors. One of these PMOS precharge transistors (shown as P30) has a drain terminal that is electrically connected to the upper match line segment ML0_c. The NOR gate 56 operates to drive the input of inverter I7 low whenever one (or both) of the lower match line signals ML0_b or ML1_b is high at the end of the preceding stage of the pipelined search operation. This driving operation, which results in a precharge of both of the upper match line segments ML0_c and ML1_c and the upper pseudo-ground line segment PGND_c, is performed in-sync with the rising edge of the look-up enable signal LUENB_c. After precharge, the upper pseudo-ground line segment PGND_c will be pulled low to commence the next stage of the pipelined search operation in-sync with a leading high-to-low edge of the active low look-up enable signal LUENB_c. When this occurs, the precharged upper match line segment ML0_c will be pulled low by NMOS pull-down transistors N31 and N32 if the lower match line segment ML0_b was inactive at a logic 0 level (to thereby indicate a miss condition in the preceding segment(s) of CAM cells) when the leading low-to-high edge of the look-up strobe signal LUSTB_b was received by the 4T inverter.

Accordingly, if either (or both) of the lower match line segments ML0_b or ML1_b are high at the end of the preceding stage of the pipelined search operation (to thereby indicate respective match conditions), then both of the upper match line segments ML0_c and ML1_c will be precharged high in preparation for the next stage of the pipelined search operation. Nonetheless, if the lower match line segment ML0_b indicates a miss condition and the lower match line segment ML1_b indicates a match condition during the preceding stage of the search operation, then the NMOS transistors N31 and N32 will operate to automatically pull-down the precharged upper match line segment ML0_c in-sync with the high-to-low transition of the upper pseudo-ground line segment PGND_c. Alternatively, if both of the lower match line segments ML0_b and ML1_b represent miss conditions during the preceding segment of the pipelined search operation, then neither of the upper match line segments ML0_c and ML1_c nor the upper pseudo-ground line segment PGND_c will be precharged high to prepare for the next stage of the search operation. Thus, power may be conserved whenever a pair of miss conditions are detected early in a pair of adjacent rows that share a pseudo-ground line.

Figure 6A:
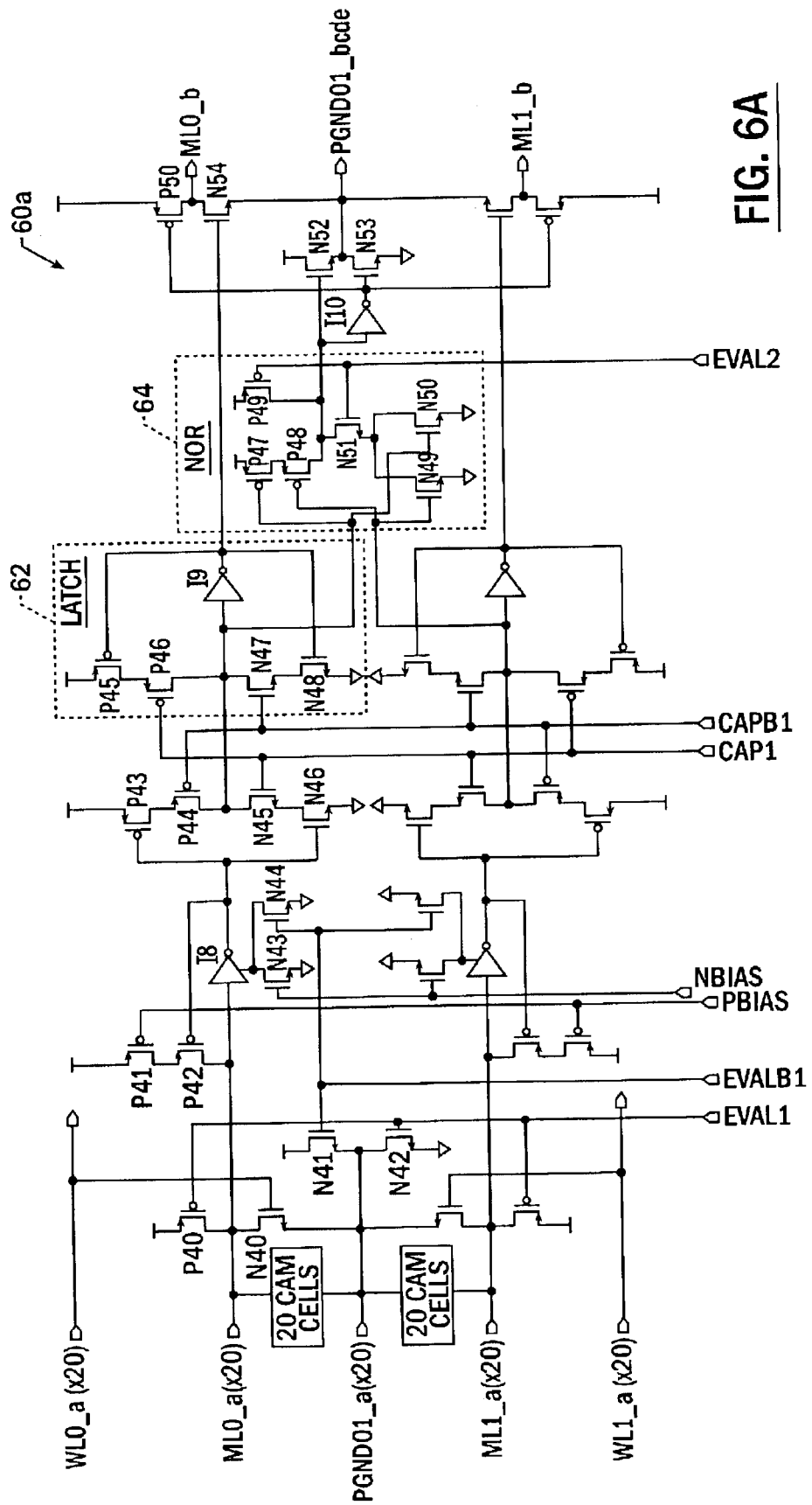
FIG. 6A is an electrical schematic of a segment-to-segment match line control circuit that is disposed between lower match line and pseudo-ground line segments and upper match line and pseudo-ground line segments in two adjacent rows of CAM cells, according to an embodiment of the present invention.

Referring now to FIG. 6A, an electrical schematic of a segment-to-segment match line control circuit 60a according to an embodiment of the present invention will be described. This control circuit 60a is connected to a pair of x20 match line segments ML0_a and ML1_a and a shared x20 pseudo-ground line segment PGND01_a. As illustrated, these match line segments span the first twenty (20) columns of CAM cells within a CAM array. As an example, the CAM array may have a logical width of 80 columns, which are divided into x20 and x60 segments, and a depth of 2048 rows. Other array widths and number of segments per array are also possible. A PMOS pull-up transistor P40 is provided for precharging the x20 match line segment ML0_a within row 0 to a full positive rail voltage of Vdd (e.g., 1 Volt) during a x20 precharge portion of a pipelined segment-to-segment search operation (i.e., x20 search operation), which may span a plurality of clock cycles. This PMOS pull-up transistor P40 has a gate terminal that is responsive to a true evaluation signal EVAL1. To conserve power during search operations, the x20 pseudo-ground line segment PGND01_a is only precharged to a maximum high voltage of Vdd−Vth by NMOS pull-up transistor N41, where Vth is the threshold voltage of NMOS pull-up transistor N41. The gate terminal of NMOS pull-up transistor N41 is responsive to the complementary evaluation signal EVALB1, which is high during the x20 precharge operation. The threshold voltage of NMOS pull-up transistor N41 may be about 0.25 Volts. At these precharged levels of 1 Volt and 0.75 Volts for the x20 match line segments and the x20 pseudo-ground line segments, respectively, the compare circuits within the CAM cells in columns 0–19 of the CAM array (i.e., the x20 segment of the CAM array) will remain inactive. NMOS pull-down transistor N40 is also provided for discharging the x20 match line segment ML0_a during an operation to write (read) an entry into (from) row 0 within the CAM array. This NMOS pull-down transistor N40 has a gate terminal that is connected to a x20 word line segment WL0_a associated with row 0 of the CAM array.

Upon commencement of a x20 search operation associated with columns 0–19 of the CAM array, the true evaluation signal EVAL1 switches low-to-high and the complementary evaluation signal EVALB1 switches high-to-low. When this occurs, the NMOS pull-down transistor N42 turns on to pull-down the x20 pseudo-ground line segment PGND01_a to a ground reference potential (e.g., Vss). In this manner, the CAM cells in the x20 segment of the CAM array are searched in-sync with the leading low-to-high edge of the true evaluation signal EVAL1. This evaluation signal EVAL1 may be synchronized with a clock signal that controls timing of the search operations (see, CLK2x in FIG. 6B).

A precharge support circuit is provided for maintaining the x20 match line segment ML0_a at its precharged voltage level when the x20 pseudo-ground line segment PGND01_a is pulled low to commence the search operation associated with the x20 segment and a x20 match condition is present in row 0. This precharge support circuit is illustrated as including two PMOS pull-up transistors P41 and P42, which are connected in series between the x20 match line segment ML0_a and a positive power supply line (Vdd). This precharge support circuit provides a relatively weak pull-up force to support the x20 match line segment ML0_a at its precharged high level. This weak pull-up force is readily overcome by a stronger pull-down force provided by any CAM cell that is indicating a miss condition during the x20 search operation (see, e.g., FIG. 3A and pull-down path provided by NMOS transistors N3–N4 or N5–N6 within a CAM cell compare circuit). The strength of the relatively weak pull-up force can be changed to account for variations in parasitic match line leakage current that may operate to discharge the x20 match line segment ML0_a to a logic 0 level. The strength of the pull-up force can be set by adjusting the magnitude of a PBIAS voltage that is received at the gate terminal of the PMOS pull-up transistor P41 during pre-package testing. The magnitude of the PBIAS voltage is typically set at a level to maintain the PMOS pull-up transistor P41 in its linear region of operation. The PBIAS voltage may be provided by an on-chip adjustable bias voltage generator 80, as illustrated by FIG. 6C-2.

A pair of inverters are provided for passing the match line signal ML0_a to a latch 62. This pair of inverters includes inverter I8 and a four transistor (4T) inverter defined by PMOS pull-up transistors P43 and P44 and NMOS pull-down transistors N45 and N46. This 4T inverter is enabled by a pair of capture signals, shown as true capture signal CAP1 and complementary capture signal CAPB1. The inverter I8 includes a sensitivity control terminal that is electrically connected to the drain terminals of a pair of NMOS transistors N43 and N44. The gate of NMOS transistor N44 is responsive to the complementary evaluation signal EVALB1 and the gate of NMOS "bias" transistor N43 is responsive to an NBIAS voltage. The magnitude of the NBIAS voltage is typically set at a level to maintain the NMOS bias transistor N43 in its linear region of operation. The NBIAS voltage may be provided by the voltage generator 80. Decreases in the magnitude of the NBIAS voltage operate to make the inverter I8 more sensitive to high-to-low transitions of the x20 match line segment ML0_a and, therefore, faster at detecting and propagating a "miss" signal. In other words, as the magnitude of the NBIAS voltage decreases, the output of the inverter I8 will more readily switch low-to-high in response to a high-to-low transition on the x20 match line segment ML0_a. This low-to-high transition at the output of the inverter I8 will also operate to turn-off PMOS pull-up transistor P42 and thereby disable the precharge support circuit.

The latch 62 includes PMOS pull-up transistors P45 and P46, NMOS pull-down transistor N47 and N48 and an inverter I9. The PMOS pull-up transistor P46 and the NMOS pull-down transistor N47 are responsive to the true and complementary capture signals CAP1 and CAPB1. If the lower match line segment ML0_a remains high at the end of the x20 search operation, then the output of the inverter I9 is switched high-to-low (or held at a low level) upon receipt of a trailing high-to-low edge of the true capture signal CAP1. This low level signal at the output of the inverter I9 operates to turn-off NMOS pull-down transistor N54. The high level signal at the input of inverter I9 is passed to an input of a two-input NOR gate 64. This NOR gate 64 includes PMOS pull-up transistors P47 and P48 and NMOS pull-down transistors N49 and N50. The NOR gate 64 also includes a PMOS pull-up transistor P49 that operates to pull-up the output of the NOR gate 64 when the true evaluation signal EVAL 2 is inactive at a low level. NMOS transistor N51 operates to enable the NOR gate 64 upon receipt of a leading low-to-high edge of the true evaluation signal EVAL2. The receipt of at least one high level signal at an input of the NOR gate 64 operates to pull-down the output of the NOR gate 64. This high-to-low transition at the output of the NOR gate 64 operates to turn off NMOS pull-up transistor N52 and turn on NMOS pull-down transistor N53. The NMOS pull-down transistor N53 has a gate terminal that is responsive to an output of the inverter I10. When the NMOS pull-down transistor N53 is turned on, a x60 pseudo-ground line segment PGND01_bcde is pulled low from a precharge level of Vdd−Vth, where Vth represents the threshold voltage of the NMOS pull-up transistor N52.

When the true evaluation signal EVAL2 is switched to an active low level, NMOS pull-up transistor N52 operates to precharge the x60 pseudo-ground line segment PGND01_ bcde and also operates to switch the output of inverter I10 low. When the output of inverter I10 is switched low, the PMOS pull-up transistor P50 turns on and precharges the match line sub-segment ML0_b. As illustrated by FIGS. 6C–6D, the match line segment ML0_b represents one of a plurality of match line "sub" segments (ML0_b, ML0_c, ML0_d and ML0_e) within a longer x60 match line segment.

In contrast, if the x20 match line segment ML0_a is pulled low by one or more of the 20 CAM cells in the x20 segment within row 0 during a x20 search operation, then the output of inverter I9 will be switched low-to-high (or held high) and the NMOS pull-down transistor N54 will be turned on. The gate of NMOS pull-down transistor N50, which represents one input of the NOR gate 64, will also be held low. If the gate of NMOS pull-down transistor N49 is held low (in response to a high-to-low transition of the x20 match line segment ML1_a during a x20 search operation), then the output of the NOR gate 64 will remain high when the true evaluation signal EVAL2 is switched low-to-high. When this occurs, the match line segments ML0_b and ML1_b and the x60 pseudo-ground line segment PGND01_bcde will remain high at their respective precharged levels.

Accordingly, whenever both of the x20 match line segments ML0_a and ML1_a are pulled low during a x20 search operation to thereby indicate miss conditions in both rows 0 and 1, the match line segments ML0_b and ML1_b and the x60 pseudo-ground line segment PGND01_bcde will all remain precharged at high levels during a next consecutive x60 search operation to conserve power (even if a x60 miss condition is present in row 0 and/or row 1). However, if either (or both) of the x20 match line segments ML0_a and ML1_a remain high during a x20 search operation, then the x60 pseudo-ground line segment PGND01_bcde will be switched high-to-low (from Vdd– Vth to Vss) at the commencement of the next x60 search operation. For example, if the x20 match line segment ML1_a remains high during a x20 search operation to thereby indicate a x20 match condition, but the x20 match line segment ML0_a is pulled low, then the x60 pseudo-ground line segment PGND01_bcde will be switched high-to-low to commence a x60 search operation and NMOS pull-down transistor N54 will be turned on to automatically pull down the match line segment ML0_b.

Figure 6B:
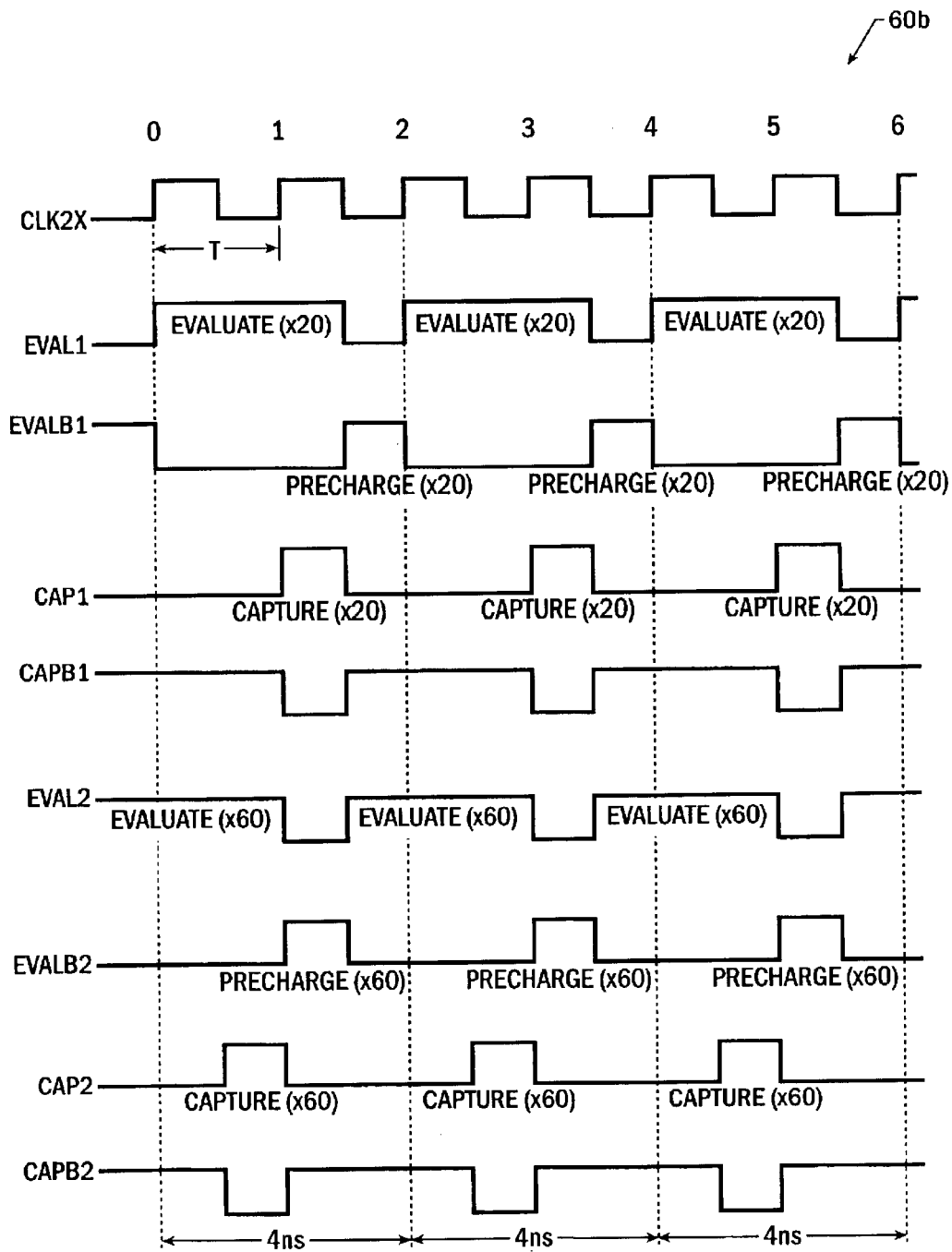
FIG. 6B is a timing diagram that illustrates operation of the circuits of FIGS. 6A and 6C–6E.
Figures 1, 6C:
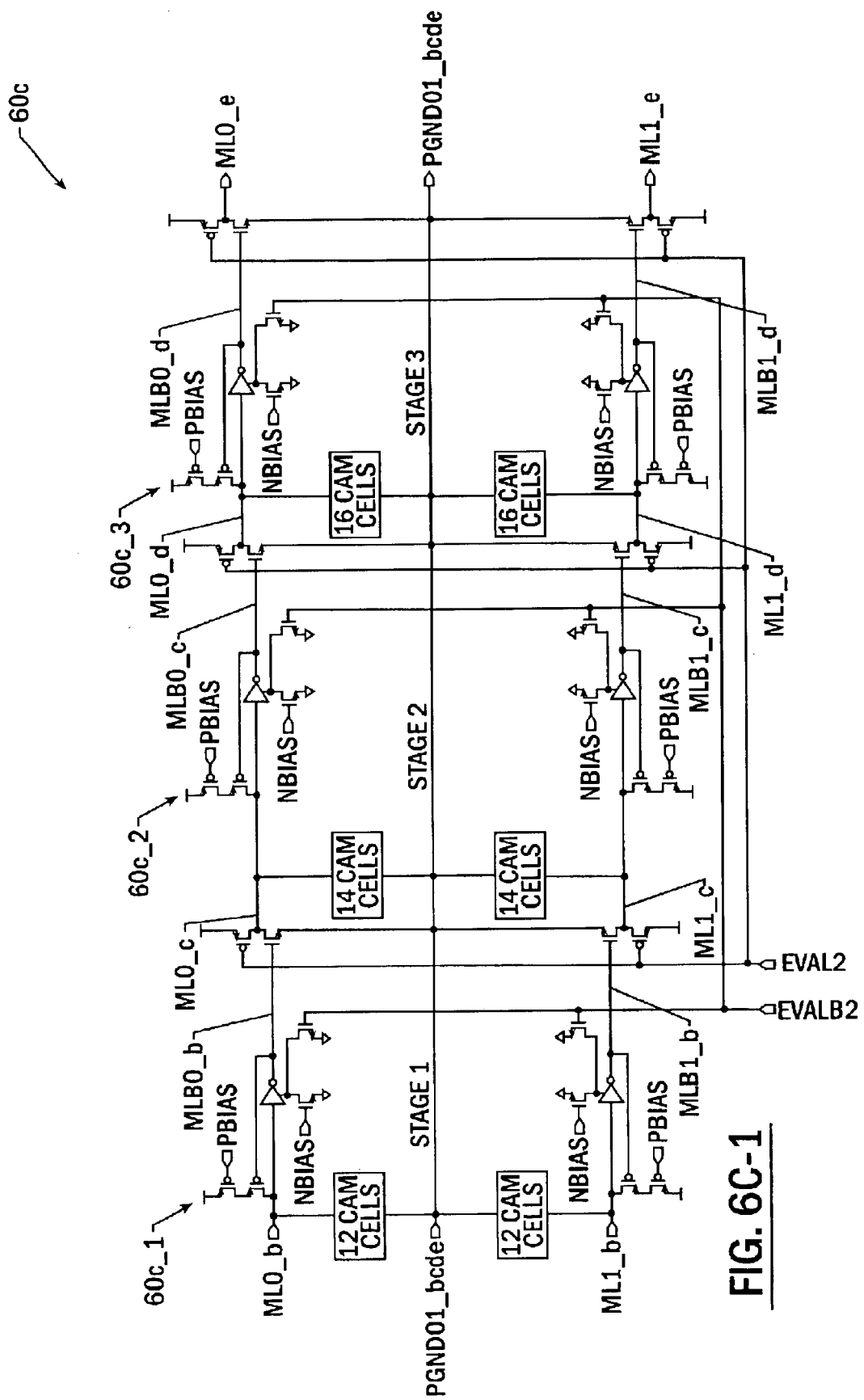
Figures 2, 6C:
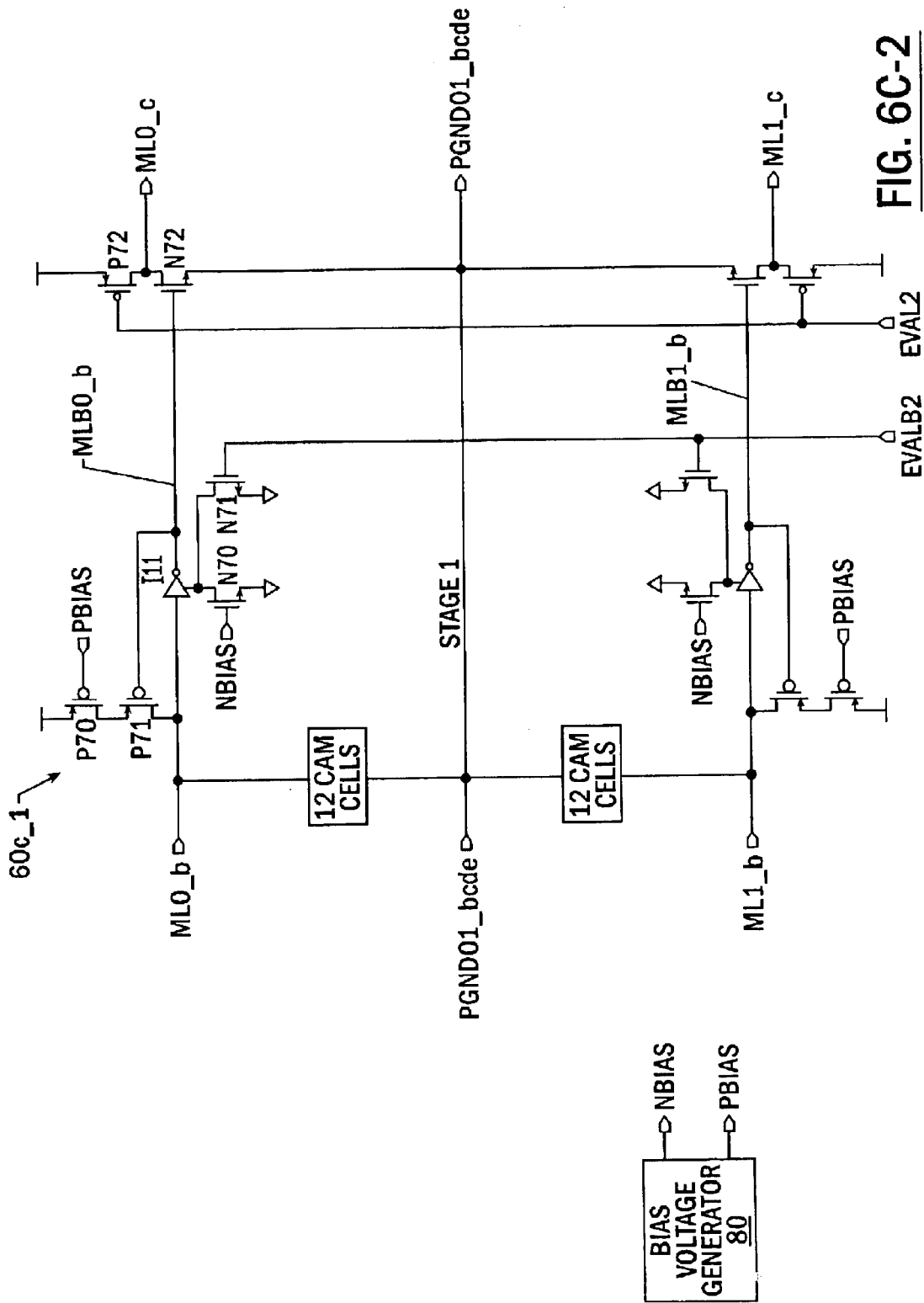
Figure 6D:
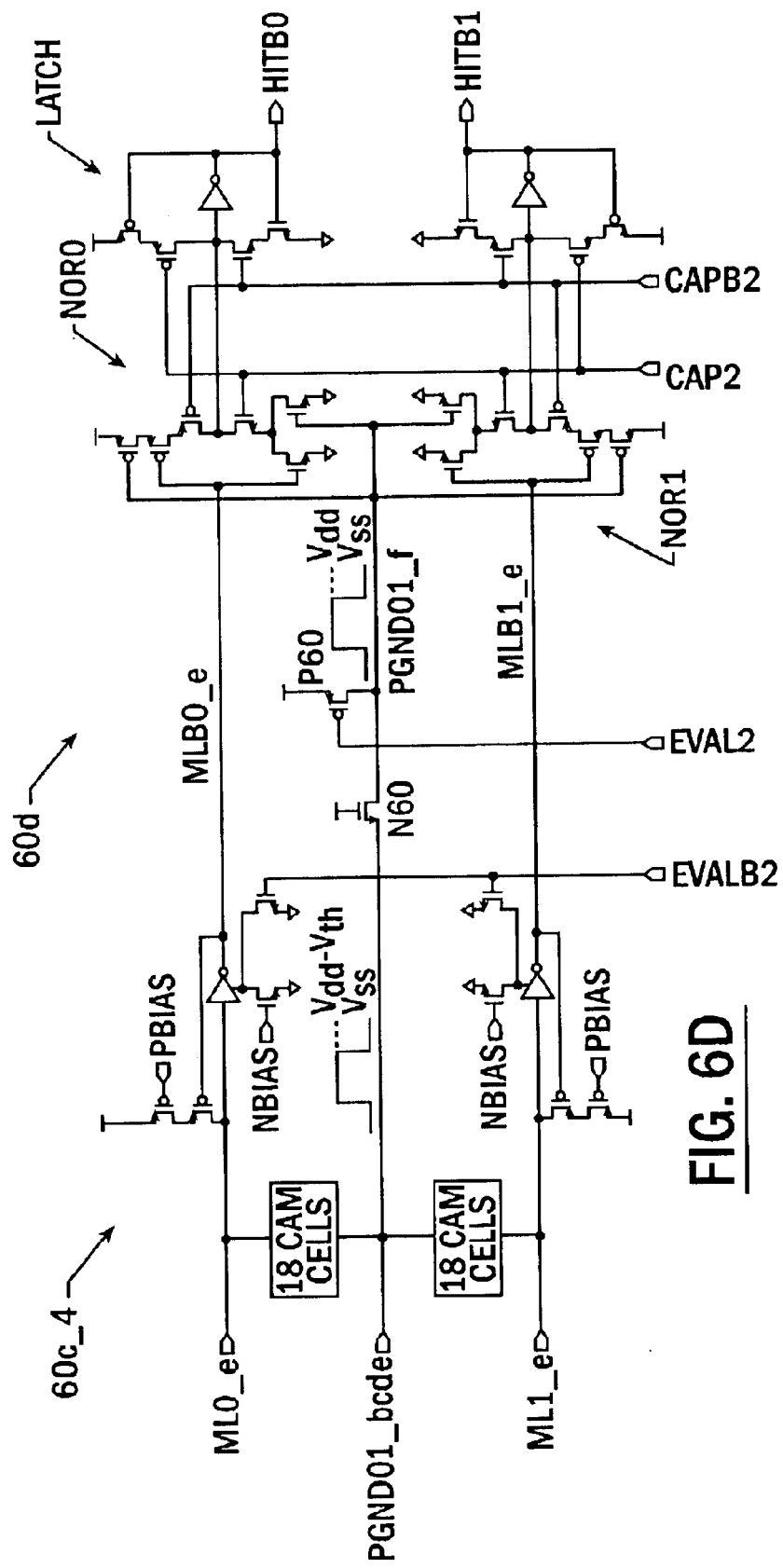
FIG. 6D is an electrical schematic of a match line signal detector according to an embodiment of the present invention.

FIG. 6B provides a timing diagram that illustrates how a plurality of pipelined search operations are performed in a segment-to-segment manner across a CAM array having a logical width of x80 columns. These search operations are performed in-sync with a clock signal, shown as CLK2x, having a period (T) of 2 ns (f=500 MHz). A x80 search operation includes an initial x20 search operation between x20 bits of an applied search word and corresponding x20 segments of the CAM array (i.e., row segments spanning columns 0–19). This initial x20 search operation is followed by a x60 search operation between the remaining x60 bits of the applied search word and corresponding x60 segments of the CAM array. In FIG. 6B, the time interval from 0T ns to 1.5T ns is allocated for performing a comparison between the x20 bits of an applied search word and the partial entries in columns 0 to 19 of the CAM array. When the true evaluation signal EVAL1 switches low to high at 0 ns, the NMOS pull-down transistor N42 in FIG. 6A turns on and pulls the x20 pseudo-ground line segment PGND01_a high-to-low to commence the x20 search operation. During the time interval from 1T ns to 1.5T ns, the match signals on the x20 match line segments are captured by a vertical column of latches 62 within the CAM array and the x60 match and pseudo-ground line segments are precharged (because EVAL2 is low from 1 to 1.5 ns). In particular, at 1.5 ns, the true capture signal CAP1 switches low to enable the latches 62 and the true evaluation signal EVAL2 associated with the x60 segment of the CAM array switches low-to-high to commence a x60 search operation, which uses the captured results of the prior x20 search operation as inputs. During the time interval from 1.5T ns to 2.0T ns, a x20 precharge operation is performed to prepare for the next x20 search operation, which commences at 2.0T ns when the true evaluation signal EVAL1 is switched low-to-high. During the time interval from 2.5T ns to 3.0T ns, the results of the x60 search operation are captured. These x20 and x60 precharge, evaluate and capture operations are again repeated in sequence during the time interval from 2.0T ns to 6.0T ns, as illustrated by FIG. 6B and described more fully hereinbelow with respect to FIGS. 6C–6F.

TABLE 2 provides a further description of the pipelined segment-to-segment search operations illustrated by the timing diagram of FIG. 6B. In particular, TABLE 2 illustrates the timing of pipelined write and pipelined read operations that are closely interleaved with pipelined search operations to reduce the occurrence of pipeline bubbles. To achieve greater timing tolerance for what are typically substantially less frequent read and write operations, each x80 write operation (or x80 read operation) includes a x20 write operation that spans a time period of 4T and a x60 write operation that also spans a time period of 4T. CAM arrays that are partitioned into three or more segments (e.g., xR, xS and xT segments) may also support an interleaved combination of write, search and read operations that occur simultaneously within respective segments of a CAM array.

Thus, as illustrated by TABLE 2, an operation to search a x80 WORD A can include a x20 search of WORD A beginning at time 2T followed by a x60 search of WORD A beginning at time 3.5 T. Then, at time 4T, a x20 search of WORD B commences and then at time 5.5T, a x60 search of WORD B commences. At time 18T, a x20 write of WORD I commences and at time 19.5T, a x60 write of WORD I commences. To provide a greater timing tolerance for each write or read operation, a x20 search operation with WORD J does not commence until time 22T, which is 4T (8 ns) after the time point of 18T when the x20 write of WORD I commenced. The entries of TABLE 2 also illustrate the timing of two consecutive write (or write and read) operations beginning at time 34T and again at time 50T.

Referring now to FIGS. 6C-1, 6C-2 and 6D, a multi-stage match line signal repeater circuit 60c according to an embodiment of the present invention will be described. In particular, FIGS. 6C-1 and 6D illustrates a four stage repeater circuit 60c that may be utilized within a pair of rows in a x60 segment of the CAM array. Thus, 1023 additional copies of the repeater circuit 60c may be provided in a CAM array having a logical depth of 2048 rows. Repeater circuits having a greater or fewer number of stages are also possible depending on array width, depth, speed and desired segment length, for example.

TABLE 2

| CAM Operations Foreground | | | |
|---|---|---|---|
| 2T → | Search_A20 | 1.5T→ | Search_Z60 |
| 4T → | Search_B20 | 3.5T→ | Search_A60 |

TABLE 2-continued

CAM Operations
Foreground

| | | | |
|---|---|---|---|
| 6T → | Search_C20 | 5.5T→ | Search_B60 |
| 8T → | Search_D20 | 7.5T→ | Search_C60 |
| 10T → | Search_E20 | 9.5T→ | Search_D60 |
| 12T → | Search_F20 | 11.5T→ | Search_E60 |
| 14T → | Search_G20 | 13.5T→ | Search_F60 |
| 16T → | Search_H20 | 15.5T→ | Search_G60 |
| 18T → | Write_I20 | 17.5T→ | Search_H60 |
| 22T → | Search_J20 | 19.5T→ | Write_I60 |
| 24T → | Search_K20 | 23.5T→ | Search_J60 |
| 26T → | Search_L20 | 25.5T→ | Search_K60 |
| 28T → | Read_M20 | 27.5T→ | Search_L60 |
| 32T → | Search_N20 | 29.5T→ | Read_M60 |
| 34T → | Write_O20 | 33.5T→ | Search_N60 |
| 38T → | Read_P20 | 35.5T→ | Write_O60 |
| 42T → | Search_Q20 | 39.5T→ | Read_P60 |
| 44T → | Search_R20 | 43.5T→ | Search_Q60 |
| 46T → | Search_S20 | 45.5T→ | Search_R60 |
| 48T → | Search_T20 | 47.5T→ | Search_S60 |
| 50T → | Write_Mask1_20 | 49.5T→ | Search_T60 |
| 54T → | Write_Mask2_20 | 51.5T→ | Write_Mask1_60 |
| 58T → | Search_U20 | 55.5T→ | Write_Mask2_60 |
| 60T → | Search_V20 | 59.5T→ | Search_U60 |
| 62T → | Search_W20 | 81.5T→ | Search_V60 |

As illustrated, the first stage 60c_1 of the repeater circuit 60c of FIG. 6C-1 is associated with a "sub" segment of the CAM array spanning 12 CAM cells and the second stage 60c_2 of the repeater circuit 60c of FIG. 6C-1 is associated with a segment of the CAM array spanning 14 CAM cells. The third stage 60c_3 and fourth stage 60c_4 span 16 and 18 CAM cells, respectively. The x60 pseudo-ground line segment PGND01_bcde spans all four stages of the repeater circuit 60c. According to a preferred aspect of this embodiment, the length of the segments in a first through fifth stages are arranged in monotonically increasing order (where $12 \leq 14 \leq 16 \leq 18$ and 12+14+16+18=60).

As illustrated by FIG. 6C-2, the first stage 60c_1 of the match line signal repeater 60c includes x12 match line segments ML0_b and ML1_b associated with row 0 and row 1 of the CAM array. An inverter I11 has an input that is electrically connected to the x12 match line segment ML0_b and an output that is electrically connected to a gate terminal of NMOS pull-down transistor N72. A precharge support circuit is illustrated as including two PMOS pull-up transistors. These transistors are shown as P70 and P71. The pull-up PMOS transistor P70 is a transistor that is biased to be in a linear mode of operation. In particular, the gate terminal of the PMOS pull-up transistor P70 is responsive to a PBIAS voltage having a magnitude that can be adjusted and set during pre-package testing. The PBIAS voltage is generated by the adjustable PBIAS voltage generator 80 illustrated by FIG. 6C-2. The PMOS pull-up transistor P70 operates as a voltage controlled impedance that influences the pull-up force provided by the precharge support circuit when the x12 match line segment ML0_b is precharged. PMOS pull-up transistor P71 is turned on when the x12 match line segment ML0_b is precharged to Vdd (see PMOS transistor P50 in FIG. 6A) and is turned off when the output of the inverter I11 switches low-to-high in response to a miss signal transition (i.e., high to low transition) on the x12 match line segment ML0_b. As illustrated by the timing diagram of FIG. 6F, this miss signal transition is repeated from the x12 match line segment ML0_b to the x18 match line segment ML0_e. The duration of the time interval "$T_{ripple}$" represents the amount of time it takes for a miss signal transition on the x12 match line segment ML0_b to ripple to an input of the NOR gate NOR0 (see, FIG. 6D). The timing diagram of FIG. 6F assumes that a miss was originally detected in row 0 of the CAM array during a x20 search operation and the entire x60 segment of the CAM array is globally masked during the following x60 search operation. The duration of the time interval $T_{ripple}$ is a function of, among other things, the value of the power supply voltage Vdd, the number of "sub" segments in the x60 segment of the CAM array and the magnitude of the voltage NBIAS, for example. Thus, the value of the voltage NBIAS can be adjusted to increase or decrease $T_{ripple}$.

The sensitivity of the inverter I11 can be adjusted to increase or decrease the overall speed of the match line signal repeater 60c. In particular, like inverter I8 in FIG. 6A, a sensitivity control terminal of the inverter I11 is connected to a drain of a NMOS bias transistor N70 and a drain of NMOS pulldown transistor N71. The gate terminal of NMOS transistor N70 is responsive to an NBIAS voltage and the gate of NMOS transistor N71 is responsive to a complementary evaluation control signal EVALB2. The source-to-drain impedance of NMOS transistor N70 can be varied in response to variations in the NBIAS voltage. The NBIAS voltage is generated by the adjustable NBIAS voltage generator 80 illustrated by FIG. 6C-2. An increase in the value of the NBIAS voltage operates to reduce the source-to-drain impedance of NMOS bias transistor N70 and decreases the sensitivity of the inverter I11 when detecting high-to-low transitions (i.e., transitions that indicate a miss condition) on the x12 match line segment ML0_b. In contrast, a decrease in the value of the NBIAS voltage enables the output of the inverter I11 to more readily switch low-to-high and thereby increases the sensitivity of the inverter I11 when detecting high-to-low transitions on the x12 match line segment ML0_b. When the x12 match line segment ML0_b switches high-to-low to thereby indicate a miss condition, the output of the inverter I11 switches low-to-high. When the output of inverter I11 switches low-to-high, the PMOS pull-up transistor P71 in the precharge support circuit is turned off and the NMOS transistor N72 is turned on. Turn on of the NMOS transistor N72 operates to automatically discharge the x14 match line segment ML0_c during the x60 search operation. Accordingly, a miss signal transition on the x12 match line segment ML0_b translates into an automatic pull-down of the x14 match line segment ML0_c by NMOS transistor N72. One or more of the fourteen (14) CAM cells associated with stage 2 of the match line signal repeater 60c may also assist in the pull-down of the x14 match line segment ML0_c during the x60 search operation. The x14 match line segment ML0_c is precharged high by PMOS pull-up transistor P72 when the true evaluation control signal EVAL2 switches high-to-low to commence a x60 precharge operation. As described above, these x60 precharge operations commence at times 1T, 3T and 5T ns in the timing diagram of FIG. 6B. The elements and operations described above with respect to the first stage 60c_1 of the match line signal repeater 60c FIG. 6C-2 are essentially identical to those in the second, third and fourth stages 60c_2–60c_4 illustrated by FIGS. 6C-1 and 6D (see, operations illustrated by TABLES 3A–3B).

Referring now to the match line signal detector 60d of FIG. 6D, if the x60 pseudo-ground line segment PGND01_bcde switches high-to-low at a commencement of a x60 search operation, then a match condition was present in either the x20 segment of row 0 and/or the x20 segment of row 1 at the end of the preceding x20 search operation. When this occurs, the final pseudo-ground line segment PGND01_f will switch low from a maximum high rail voltage of Vdd to a low rail level of Vss. As illustrated, NMOS pass transistor N60 will operate as a pull-down transistor when segment PGND01_bcde switches high-to-low. However, if the x60 pseudo-ground line segment PGND01_bcde remains high after the commencement of the x60 search operation, then neither row 0 nor row 1 has a matching entry. When this dual miss condition is present, the final pseudo-ground line segment PGND01_f will remain high at a full rail voltage of Vdd (NMOS transistor N60 will provide a voltage drop equal to Vth between PGND01_f and PGND01_bcde). If the final pseudo-ground line segment PGND01_f remains high after the commencement of the x60 search operation, then both of the x18 match line segments ML0_e and ML1_e will also remain high at the end of the x60 search operation and both of the complementary match line segments MLB0_e and MLB1_e will remain low. When this occurs, the six transistor (6T) NOR gate (NOR0) at the end of row 0 will have an output that is switched high-to-low when the true capture signal CAP2 switches low-to-high and the complementary capture signal CAPB2 switches high-to-low. This 6T NOR gate NOR0 includes an NMOS control transistor having a gate terminal that is responsive to the true capture signal CAP2 and a PMOS control transistors having a gate terminal that is responsive to a complementary capture signal CAPB2. If the output of NOR gate NOR0 is low, then the complementary hit signal output for row 0 (HITB0) will switch low-to-high (or be held high) when the true capture signal CAP2 switches high,to-low and the complementary capture signal CAPB2 switches low-to-high. This indicates a miss condition in row 0 upon completion of the x80 search operation. The output of NOR gate NOR1 will also be low to indicate a miss condition in row 1.

Alternatively, if the complementary match line segment MLB0_e remains low at the end of the x60 search operation and the final pseudo-ground line PGND_f is also low, the output of NOR gate NOR0 will switch high (or remain high) and the output HITB0 will switch low (or stay low) in-sync with a high-to-low transition of the true capture signal CAP2. This low state of the output HITB0 will indicate a match condition in row 0. Similarly, if the complementary match line segment MLB1_e remains low at the end of the x60 search operation and the final pseudo-ground line PGND_f is also low, the output of NOR gate NOR0 will switch high (or remain high) and the output HITB1 will switch low (or stay low) in-sync with a high-to-low transition of the true capture signal CAP2. This low state of the output HITB1 will indicate a match condition in row 1.

Many of the operations described above with respect to FIGS. 6A–6D will now be more fully described with reference to the timing diagram of FIG. 6B and the operations illustrated by TABLES 3A–3B. These operations assume that all comparand bits associated with each x60 segment of each search word are globally masked during each search operation. In particular, TABLES 3A–3B provide snapshots of the high or low states of various match and pseudo-ground lines within rows 0 and 1 of the CAM array at time points ranging from 0T to 6T (12 ns). Four x20 search operations for four consecutive x80 search words commence at times 0T, 2T, 4T and 6T ns.

TABLE 3A

|  | 0T(−) | 0T(+) | 0.5T(+) | 1T(+) | 1.5T(+) | 2T(+) | 2.5T(+) |
| --- | --- | --- | --- | --- | --- | --- | --- |
| ML0_a | ↑Vdd | 1 | 1 | 1 (x20 Hit) | ↑Vdd | 1 | 1 |
| PGND01_a | ↑Vdd–Vth | →0 | 0 | 0 | ↑Vdd–Vth | →0 | 0 |
| ML1_a | ↑Vdd | 1 | 1 | 1 (x20 Hit) | ↑Vdd | →0 | 0 |
| ML0_b | — | — | — | ↑Vdd | 1 | 1 | 1 |
| MLB0_b | — | — | — | ↓Vss | 0 | 0 | 0 |
| PGND01_bcde | — | — | — | ↑Vdd–Vth | →0 | 0 | 0 |
| ML1_b | — | — | — | ↑Vdd | 1 | 1 | 1 |
| MLB1_b | — | — | — | ↓Vss | 0 | 0 | 0 |
| ML0_c | — | — | — | ↑Vdd | 1 | 1 | 1 |
| MLB0_c | — | — | — | ↓Vss | 0 | 0 | 0 |
| ML1_c | — | — | — | ↑Vdd | 1 | 1 | 1 |
| MLB1_c | — | — | — | ↓Vss | 0 | 0 | 0 |
| ML0_d | — | — | — | ↑Vdd | 1 | 1 | 1 |
| MLB0_d | — | — | — | ↓Vss | 0 | 0 | 0 |
| ML1_d | — | — | — | ↑Vdd | 1 | 1 | 1 |
| MLB1_d | — | — | — | ↓Vss | 0 | 0 | 0 |
| ML0_e | — | — | — | ↑Vdd | 1 | 1 | 1 |
| MLB0_e | — | — | — | ↓Vss | 0 | 0 | 0 |
| PGDN01_f | — | — | — | ↑Vdd | →0 | 0 | 0 |
| ML1_e | — | — | — | ↑Vdd | 1 | 1 | 1 |
| MLB1_e | — | — | — | ↓Vss | 0 | 0 | 0 |
| HITB0 | — | — | — | — | — | — | — |
| HITB1 | — | — | — | — | — | — | — |

TABLE 3B

|  | 3T(+) | 3.5T(+) | 4T(+) | 4.5T(+) | 5T(+) | 5.5T(+) | 6T(+) |
| --- | --- | --- | --- | --- | --- | --- | --- |
| ML0_a | 1 (x20 Hit) | ↑Vdd | →0 | 0 | 0 (x20 Miss) | ↑Vdd | 1 |
| PGND01_a | 0 | ↑Vdd–Vth | →0 | 0 | 0 | ↑Vdd–Vth | →0 |
| ML1_a | 0 (x20 Miss) | ↑Vdd | →0 | 0 | 0 (x20 Miss) | ↑Vdd | 1 |
| ML0_b | ↑Vdd | 1 | 1 | 1 | ↑Vdd | (Hold x60) | (Hold x60) |
| MLB0_b | ↓Vss | 0 | 0 | 0 | ↓Vss | (Hold x60) | (Hold x60) |
| PGND01_bcde | ↑Vdd–Vth | →0 | 0 | 0 | ↑Vdd–Vth | Vdd–Vth | Vdd–Vth |

TABLE 3B-continued

|  | 3T(+) | 3.5T(+) | 4T(+) | 4.5T(+) | 5T(+) | 5.5T(+) | 6T(+) |
|---|---|---|---|---|---|---|---|
| ML1_b | ↑Vdd | →0 | 0 | 0 | ↑Vdd | (Hold ×60) | (Hold ×60) |
| MLB1_b | ↓Vss | →1(r) | 1 | 1 | ↓Vss | (Hold ×60) | (Hold ×60) |
| ML0_c | ↑Vdd | 1 | 1 | 1 | ↑Vdd | (Hold ×60) | (Hold ×60) |
| MLB0_c | ↓Vss | 0 | 0 | 0 | ↓Vss | (Hold ×60) | (Hold ×60) |
| ML1_c | ↑Vdd | →0(r) | 0 | 0 | ↑Vdd | (Hold ×60) | (Hold ×60) |
| MLB1_c | ↓Vss | →1(r) | 1 | 1 | ↓Vss | (Hold ×60) | (Hold ×60) |
| ML0_d | ↑Vdd | 1 | 1 | 1 | ↑Vdd | (Hold ×60) | (Hold ×60) |
| MLB0_d | ↓Vss | 0 | 0 | 0 | ↓Vss | (Hold ×60) | (Hold ×60) |
| ML1_d | ↑Vdd | →0(r) | 0 | 0 | ↑Vdd | (Hold ×60) | (Hold ×60) |
| MLB1_d | ↓Vss | →1(r) | 1 | 1 | ↓Vss | (Hold ×60) | (Hold ×60) |
| ML0_e | ↑Vdd | 1 | 1 | 1 | ↑Vdd | (Hold ×60) | (Hold ×60) |
| MLB0_e | ↓Vss | 0 | 0 | 0 | ↓Vss | (Hold ×60) | (Hold ×60) |
| PGDN01_f | ↑Vdd | →0 | 0 | 0 | ↑Vdd | Vdd | Vdd |
| ML1_e | ↑Vdd | →0(r) | 0 | 0 | ↑Vdd | (Hold ×60) | (Hold ×60) |
| MLB1_e | ↓Vss | →1(r) | 1 | 1 | ↓Vss | (Hold ×60) | (Hold ×60) |
| HITB0 | (0=Match) | 0 | 0 | 0 | (0=Match) | 0 | 0 |
| HITB1 | (0=Match) | 0 | 0 | 0 | (1=Miss) | 1 | 1 |

At time 0T(−), a x20 precharge operation is completed and at time 0T(+), the x20 pseudo-ground line segment PGND01_a is switched high-to-low (see NMOS transistor N42 in FIG. 6A). Commencing at time 1T(+), a x20 match for row 0 and a x20 match for row 1 are captured and a x60 precharge operation is performed. At time 1.5T(+), the x20 capture is complete and another x20 precharge operation is performed. When this occurs, the x20 pseudo-ground line segment PGND01_a will be precharged to a maximum positive voltage of Vdd−Vth and the x20 match line segments ML0_a and ML1_a will remain high at their previously precharged levels. Also at time 1.5T(+), the x60 pseudo-ground line segment PGND01_bcde (and final pseudo-ground line segment PGND01_f) will be switched high-to-low to commence a x60 search operation because at least one x20 match was detected in rows 0 and 1 during the prior x20 search operation.

At time 2T(+), the x20 match line segment ML1_a is pulled low to indicate a x20 miss in row 1 of the CAM array. However, the x20 match line segment ML0_a remains high to indicate a x20 match condition. At time 3T(+), the x20 miss in row 1 is captured and the x60 segment undergoes a precharge operation. Moreover, when the true capture signal CAP2 switches high-to-low at 3T(+), the prior x20 match conditions (now reflected as x80 match conditions because of the x60 global masking) will be reflected in the outputs HITB0 and HITB1.

At time 3.5T(+), the x20 miss in row 1 will be reflected in an automatic pull-down of the x12 match line segment ML1_b and pull-up of the match line segment MLB1_b in the x60 segment of the CAM array. This down-and-up sequence will ripple (r) across the x14, x16 and x18 segments associated with row 1. As described above, the magnitude of the NBIAS voltage can be adjusted to increase the speed of the ripple. At this time of 3.5T(+), the x20 segment of the CAM array undergoes another x20 precharge operation. Then, at time 4T(+), two x20 misses associated with rows 0 and 1 will be reflected in the pull-down of the x20 match line segments ML0_a and ML1_a. At time 4.5T(+), the capture of the x60 segment conditions commences. At time 5T(+), the x60 capture is complete and the match on row 0 and the miss on row 1 (from the prior x20 search operation) are reflected in the output HITB0, which remains low to indicate a row 0 match, and the output HITB1, which switches high to indicate a miss in row 1.

At time 5T(+), the x20 miss conditions associated with rows 0 and 1 are also captured. At time 5.5T(+), these two x20 miss conditions are transferred to the x60 segment of the CAM array. These two miss conditions in a connected pair of rows cause row 0 and row 1 in the x60 segment of the CAM array to remain idle during the next x60 search operation and thereby conserve power. At time 5.5T(+), the x20 segment of the CAM array also undergoes a precharge operation and at 6T(+), the next x20 search operation is commenced.

Figure 6E:
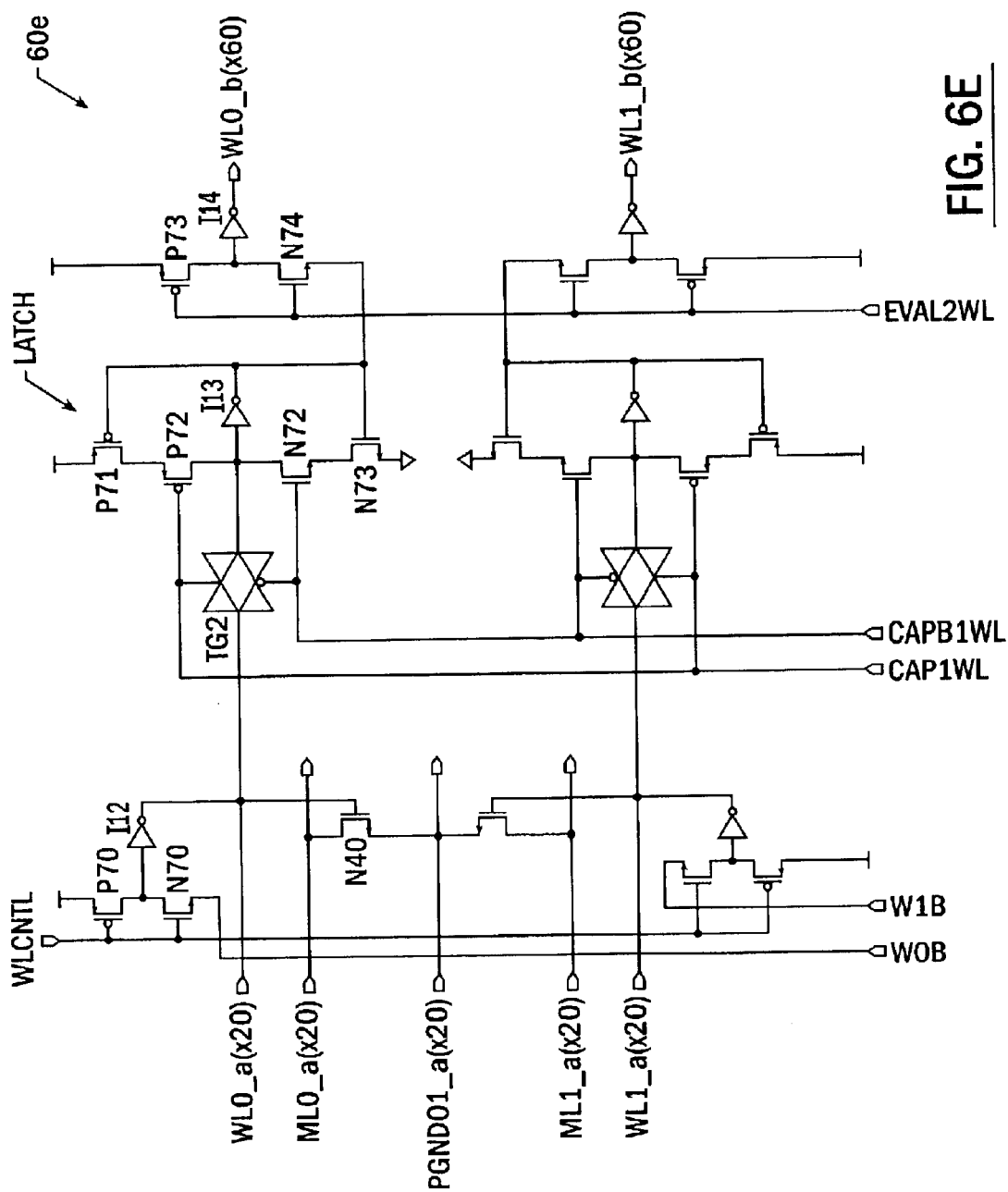
FIG. 6E is an electrical schematic of a segment-to-segment word line control circuit according to an embodiment of the present invention.
Figure 6F:
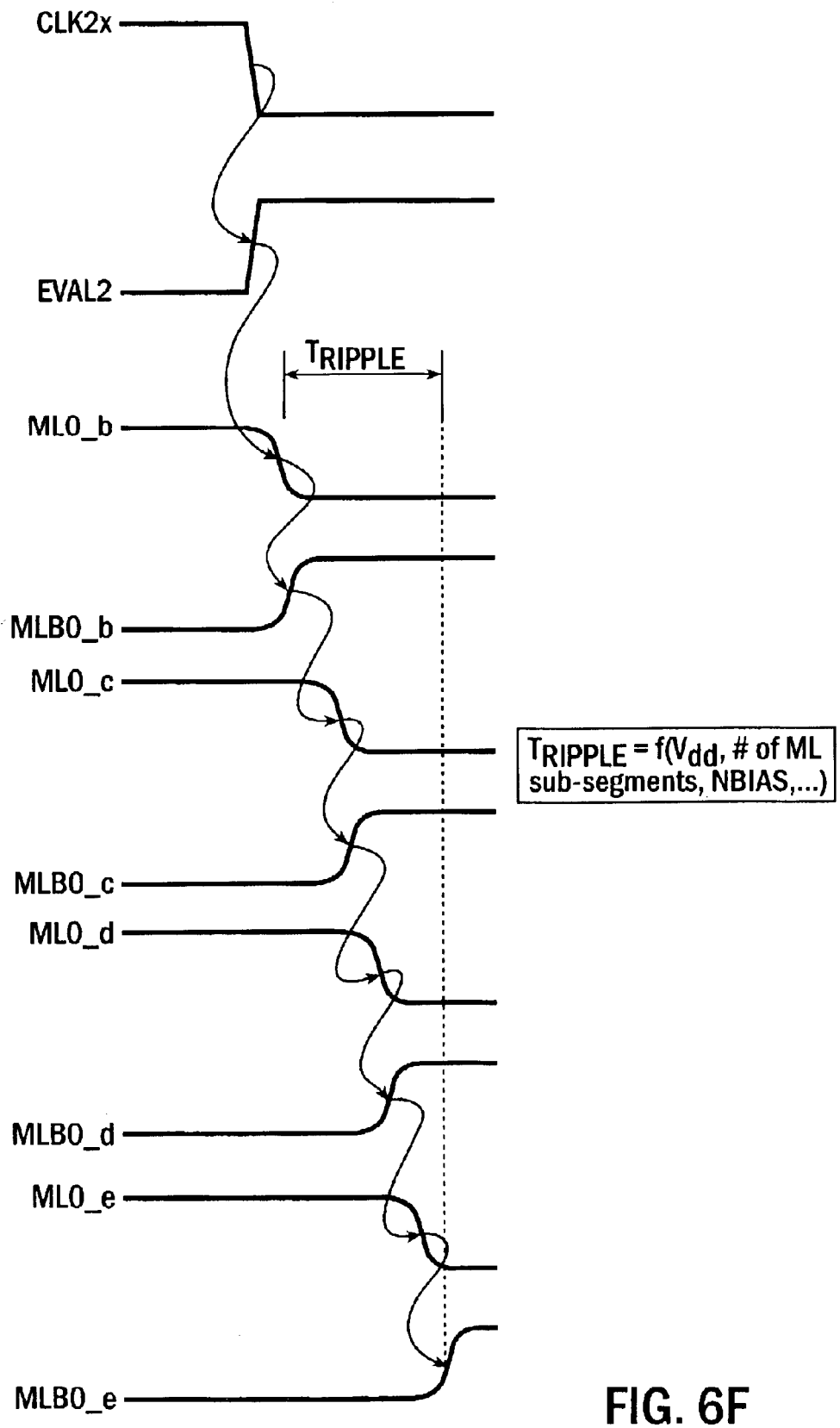
FIG. 6F is a timing diagram that illustrates how a miss signal transition is repeated across the plurality a match line "sub" segments illustrated by FIGS. 6C-1 and 6D.

Referring now to FIG. 6E, a segment-to-segment word line control circuit 60e according to an embodiment of the present invention will be described. This word line control circuit 60e and match line control circuit 60a collectively form a segment-to-segment interface circuit. This word line control circuit 60e, which performs functions similar to the word line control circuit 50a illustrated in FIG. 5, receives word line signals on a pair of x20 word line segments WL0_a and WL1_a. These word line segments WL0_a and WL1_a correspond to those illustrated on the left side of FIG. 6A. With respect to the upper half of the word line control circuit 60e, which is essentially a mirror image of the lower half, an NMOS pull-down transistor N40 may be provided. This NMOS pull-down transistor N40 may be useful in facilitating the performance of a parity-check read when a search operation is being performed. If this feature is not desired, the NMOS pull-down transistor N40 can be omitted. The x20 word line segment WL0_a is driven high during a x20 write operation by switching an input of inverter I12 high-to-low. The input of inverter I12 is pulled high-to-low when the active low control signal line W0B is held low and a leading high-to-low edge of a x20 word line control signal WLCNTL is received at the gate terminals of PMOS pull-up transistor P70 and NMOS pull-down transistor N70. Thus, receipt of a leading edge of the x20 word line control signal WLCNTL will operate to pull-down the input of inverter I12 to the low potential of the control signal line W0B. The active low control signal line W1B operates in a similar manner with respect to the x20 word line segment WL1_a associated with row 1 of the CAM array.

A transmission gate TG2 is provided for capturing the active high state of the x20 word line segment WL0_a at the conclusion of a x20 write operation to row 0. As illustrated, the transmission gate TG2 is active to pass the high level on the x20 word line segment to an input of a latch when a leading edge of an active high true word line capture signal CAP1WL and a leading edge of an active low complementary word line capture signal CAPB1WL are received. The latch, which comprises a four transistor (4T) inverter and a two transistor inverter I13, is enabled in response trailing edges of the word line capture signals CAP1WL and CAPB1WL. Thus, upon receipt of the trailing edges of the capture signals, the output of inverter I13 will switch high-to-low and become latched at the low level. This low level at the output of the inverter I13 will be passed as an active high signal to the x60 word line segment WL0_b by turning on NMOS pull-down transistor N74 and thereby switching the input of inverter I14 high-to-low. NMOS pull-down transistor N74 is turned on in-sync with a leading low-to-high edge of an active high word line evaluation signal EVAL2WL. The x60 word line segment WL0_b will otherwise remain inactive at a low level while PMOS pull-up transistor P73 is active in response to an inactive low state of the active high word line evaluation signal line EVAL2WL. In this manner, a pipelined segment-to-segment write operation may proceed as a x20 write operation on a respective row followed by a x60 write operation to the same row. Similarly, a pipelined segment-to-segment read operation may proceed as a x20 read operation (with WL0_a set high) from a respective row followed by a x60 read operation (with WL0_b set high) from the same row. As illustrated by TABLE 2, each of these write and read operations may be closely interleaved with pipelined search operations in order to reduce pipeline bubbles.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A content addressable memory (CAM) device, comprising:
   a CAM array block having a first row of CAM cells therein that comprises:
      a first match line segment that is electrically coupled to a first segment of CAM cells in the first row;
      a second match line segment that is electrically coupled to a second segment of CAM cells in the first row;
      a pseudo-ground line segment that is electrically connected to the first and second segment of CAM cells; and
      a speed adjustable match line signal repeater that is configured to detect and propagate a miss signal transition from the first match line segment to the second match line segment during a search operation.

2. The CAM device of claim 1, wherein said match line signal repeater is configured to propagate the miss signal transition in-sync with a high-to-low transition of the pseudo-ground line segment.

3. The CAM device of claim 2, wherein said match line signal repeater is configured to propagate the miss signal transition in-sync with a high-to-low transition of the pseudo-ground line segment from a maximum high voltage of (Vdd−Vth) to a low voltage of Vss, where Vdd is a power supply voltage, Vth is a threshold voltage of an NMOS transistor and Vss is a reference supply voltage.

4. The CAM device of claim 3, wherein said match line signal repeater comprises an inverter having an input that is electrically coupled to the first match line segment, an output and a sensitivity control terminal.

5. The CAM device of claim 1, wherein said match line signal repeater comprises an inverter having an input that is electrically coupled to the first match line segment, an output and a sensitivity control terminal.

6. The CAM device of claim 5, wherein said match line signal repeater comprises a voltage-controlled impedance element that is electrically coupled in series between the sensitivity control terminal of the inverter and a reference supply line.

7. The CAM device of claim 6, wherein the voltage-controlled impedance element comprises an NMOS bias transistor having a gate electrode that receives an adjustable N-bias voltage; and wherein the N-bias voltage has a magnitude that disposes the NMOS bias transistor in its linear region of operation.

8. The CAM device of claim 7, wherein said match line signal repeater further comprises an NMOS pull-down transistor having a first current carrying terminal that is electrically connected to the sensitivity control terminal, a second current carrying terminal that is electrically connected to the reference supply line and a gate terminal that is responsive to an evaluation control signal.

9. The CAM device of claim 6, wherein said match line signal repeater comprises an NMOS pull-down transistor having a gate that is electrically coupled to the output of the inverter and a first current carrying terminal that is electrically connected to the second match line segment.

10. The CAM device of claim 6, wherein said match line signal repeater further comprises an NMOS pull-down transistor having a first current carrying terminal electrically connected to the sensitivity control terminal, a second current carrying terminal electrically connected to the reference supply line and a gate terminal that is responsive to an evaluation control signal.

11. The CAM device of claim 5, further comprising a precharge support circuit that is electrically coupled between the first match line segment and a power supply line, said precharge support circuit having a first control input that is electrically coupled to the output of the inverter.

12. The CAM device of claim 11, wherein the precharge support circuit comprises first and second PMOS pull-up transistors that are electrically connected in series between the first match line segment and the power supply line.

13. The CAM device of claim 12, wherein a gate electrode of the first PMOS pull-up transistor is electrically coupled to the first control input of the precharge support circuit.

14. The CAM device of claim 13, wherein a gate electrode of the second PMOS pull-up transistor is responsive to a P-bias voltage having a magnitude that disposes the second PMOS bias transistor in the linear region of operation.

15. The CAM device of claim 5, wherein said match line signal repeater comprises:
   an NMOS pull-down transistor having a gate that is electrically coupled to the output of the inverter, a first current carrying terminal that is electrically connected to the second match line segment and second current carrying terminal that is electrically connected to the pseudo-ground line segment; and
   a PMOS pull-up transistor having a gate that is responsive to a control signal, a first current carrying terminal that is electrically connected to the second match line segment and a second current carrying terminal that is electrically connected to a power supply line.

16. A content addressable memory (CAM) device, comprising:
   a CAM array block having a first row of CAM cells therein that comprises:
      a first match line segment that is electrically coupled to a final segment of CAM cells in the first row;
      a second match line segment that is electrically coupled to a second segment of CAM cells in the first row; and a speed adjustable match line signal repeater that is configured to detect and propagate a miss signal transition from the first match line segment to the second match line segment during a search operation.

17. A content addressable memory (CAM) device, comprising:
a CAM array block having a pair of rows of CAM cells therein that comprise:
first and second match line segments associated with a first row of CAM cells;
third and fourth match line segments associated with a second row of CAM cells;
a pseudo-ground line segment that is electrically coupled to the first and second rows of CAM cells;
a first match line signal repeater that is electrically coupled to the first and second match line segments and the pseudo-ground line segment, said first match line signal repeater configured to detect and propagate a first miss signal transition from the first match line segment to the second match line segment during a search operation; and
a second match line signal repeater that is electrically coupled to the third and fourth match line segments and the pseudo-ground line segment, said second match line signal repeater configured to detect and propagate a second miss signal transition from the third match line segment to the fourth match line segment during the search operation.

18. The CAM device of claim 17, wherein the first match line signal repeater comprises:
an NMOS pull-down transistor having a first current carrying terminal electrically connected to the second match line segment and a second current carrying terminal electrically connected to the pseudo-ground line segment; and
an inverter having an input that is electrically coupled to the first match line segment and an output that is electrically connected to a gate terminal of the NMOS pull-down transistor.

19. The CAM device of claim 18, further comprising a precharge support circuit that is electrically coupled between the first match line segment and a power supply line, said precharge support circuit comprising a first PMOS pull-up transistor having a first current carrying terminal electrically connected to the first match line segment and a gate terminal electrically coupled an output of said inverter.

20. The CAM device of claim 19, wherein the precharge support circuit further comprises a second PMOS pull-up transistor having a first current carrying terminal electrically connected to a second current carrying terminal of the first PMOS pull-up transistor, a second current carrying terminal electrically connected to the power supply line and a gate terminal that is responsive to a P-bias voltage having a magnitude that disposes the second PMOS pull-up transistor in a linear mode of operation.

21. A content addressable memory (CAM) device, comprising:
a CAM array having a first row of CAM cells therein that comprises:
a first match line segment that is electrically coupled to a first segment of CAM cells in the first row;
a second match line segment that is electrically coupled to a second segment of CAM cells in the first row;
a pseudo-ground line segment that is electrically connected to the first and second segments of CAM cells; and
a speed adjustable match line signal repeater that is configured to detect and propagate a miss signal transition from the first match line segment to the second match line segment in-sync with a high-to-low transition of said pseudo-ground line segment during a search operation.

22. A content addressable memory (CAM) device, comprising:
a CAM array having a first row of CAM cells therein that comprises:
a first match line segment that is electrically coupled to a first segment of CAM cells in the first row;
a second match line segment that is electrically coupled to a second segment of CAM cells in the first row;
a pseudo-ground line segment that is electrically connected to the first and second segments of CAM cells; and
a match line signal repeater that is configured to detect and propagate a miss signal transition from the first match line segment to the second match line segment in-sync with a high-to-low transition of said pseudo-ground line segment during a search operation.

* * * * *

UNITED STATES PATENT AND TRADEMARK OFFICE
CERTIFICATE OF CORRECTION

PATENT NO.    : 6,760,242 B1
DATED         : July 6, 2004
INVENTOR(S)   : Kee Park et al.

It is certified that error appears in the above-identified patent and that said Letters Patent is hereby corrected as shown below:

Column 36,
Line 64, please change "final" to -- first --.

Signed and Sealed this

Thirtieth Day of November, 2004

JON W. DUDAS
*Director of the United States Patent and Trademark Office*